(12) United States Patent
Kawahara et al.

(10) Patent No.: US 12,641,904 B2
(45) Date of Patent: May 26, 2026

(54) LIGHT RECEIVING ELEMENT AND LIGHT DETECTOR

(71) Applicant: SUMITOMO ELECTRIC INDUSTRIES, LTD., Osaka (JP)

(72) Inventors: Takahiko Kawahara, Osaka (JP); Kenichi Machinaga, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 395 days.

(21) Appl. No.: 18/460,942

(22) Filed: Sep. 5, 2023

(65) Prior Publication Data

US 2024/0105752 A1      Mar. 28, 2024

(30) Foreign Application Priority Data

Sep. 22, 2022    (JP) ................................ 2022-151410
Apr. 6, 2023    (JP) ................................ 2023-061884

(51) Int. Cl.
  *H10F 39/00*       (2025.01)
  *H10F 77/124*     (2025.01)
  *H10F 77/14*       (2025.01)

(52) U.S. Cl.
  CPC ....... *H10F 39/807* (2025.01); *H10F 39/8033* (2025.01); *H10F 77/124* (2025.01); *H10F 77/147* (2025.01); *H10F 39/8057* (2025.01)

(58) Field of Classification Search
  CPC .............. H10F 77/124; H10F 77/1243; H10F 77/1248; H10F 77/14–148
  See application file for complete search history.

(56) References Cited

U.S. PATENT DOCUMENTS 5,748,661 A * 5/1998 Kiely ................... H01S 5/0264
                                                      372/50.1
6,990,135 B2 * 1/2006 Johnson ................. H01S 5/423
                                                      372/45.01

(Continued)

FOREIGN PATENT DOCUMENTS

EP            1182705          2/2002
JP       H11150288 A  *  6/1999

(Continued)

OTHER PUBLICATIONS

Machine translation of JP-2008205499-A (Year: 2008).*
Machine translation of JP-H11150288-A (Year: 1999).*

*Primary Examiner* — Bryan R Junge
(74) *Attorney, Agent, or Firm* — IPUSA, PLLC

(57)                ABSTRACT

A light receiving element includes a substrate having a first main surface, and includes a light receiving layer provided on the first main surface. The light receiving layer includes a first semiconductor layer and a second semiconductor layer provided on the first semiconductor layer. The light receiving element includes a contact layer provided on the light receiving layer, and includes a groove that separates the contact layer for each pixel. The first semiconductor layer includes a type-II quantum-well layer including an InGaAs layer and a GaAsSb layer. The second semiconductor layer includes a $Al_xGa_yIn_{1-x-y}As$ layer, where $0 \le x < 1$, $0 \le y < 1$, and $0 < x+y < 1$. The bottom surface of the groove is situated between a top surface and a bottom surface of the second semiconductor layer, and the light receiving layer includes an n-type region below an exposed portion of a bottom surface of the groove.

14 Claims, 21 Drawing Sheets

700

(56)         References Cited

U.S. PATENT DOCUMENTS

| | | | |
|---|---|---|---|
| 2010/0019275 A1 * | 1/2010 | Nakata | H10F 30/2255 |
| | | | 257/E31.019 |
| 2012/0168720 A1 * | 7/2012 | Akita | H10F 30/222 |
| | | | 438/94 |
| 2014/0197373 A1 * | 7/2014 | Iguchi | H10F 30/222 |
| | | | 438/39 |
| 2015/0069217 A1 * | 3/2015 | Taylor | H10F 39/8033 |
| | | | 257/14 |
| 2015/0228685 A1 | 8/2015 | Uchida et al. | |
| 2015/0243825 A1 * | 8/2015 | Keasler | H10F 39/807 |
| | | | 257/184 |
| 2015/0349151 A1 * | 12/2015 | Mollard | H10F 39/198 |
| | | | 257/443 |
| 2017/0294547 A1 * | 10/2017 | Shibata | H10F 77/146 |
| 2019/0296058 A1 * | 9/2019 | Huang | H10F 39/103 |
| 2022/0416110 A1 * | 12/2022 | Tan | H10F 30/2255 |
| 2024/0387764 A1 * | 11/2024 | Liu | H10F 77/306 |

FOREIGN PATENT DOCUMENTS

| | | | | |
|---|---|---|---|---|
| JP | 2001-144278 | | 5/2001 | |
| JP | 2008205499 A | * | 9/2008 | |
| JP | 2013-175686 | | 9/2013 | |
| JP | 2015-149422 | | 8/2015 | |
| WO | WO-2011144938 A2 | * | 11/2011 | H10F 77/1248 |

* cited by examiner

97  PRE-AMPLIFIER

98  LOCK-IN AMPLIFIER

99  COMPUTER

LIGHT RECEIVING ELEMENT AND LIGHT DETECTOR

CROSS-REFERENCE TO RELATED APPLICATIONS

This application claims priority to Japanese Patent Applications Nos. 2022-151410, filed on Sep. 22, 2022, and 2023-061884, filed on Apr. 6, 2023, the entire contents of which are incorporated herein by reference.

TECHNICAL FIELD

The present disclosure relates to a light receiving element and a light detector.

BACKGROUND

As light receiving elements that detect infrared rays, light receiving elements in each of which a light receiving layer includes a type-II quantum-well layer are disclosed. In each light receiving element, grooves for pixel separation are formed, and a mesa is provided for each pixel.

[Patent Document 1] Japanese Unexamined Patent Application Publication No. 2001-144278
[Patent Document 2] Japanese Unexamined Patent Application Publication No. 2013-175686
[Patent Document 3] Japanese Unexamined Patent Application Publication No. 2015-149422

SUMMARY

A light receiving element in the present disclosure includes a substrate having a first main surface, and includes a light receiving layer provided on the first main surface. The light receiving layer includes a first semiconductor layer provided on the first main surface, and includes a second semiconductor layer provided on the first semiconductor layer, the second semiconductor layer having a top surface and a bottom surface. The light receiving element includes a contact layer provided on the light receiving layer, and includes a groove that separates the contact layer for each pixel, the groove having a bottom surface. The first semiconductor layer includes a type-II quantum-well layer including an InGaAs layer and a GaAsSb layer. The second semiconductor layer includes a $Al_xGa_yIn_{1-x-y}As$ layer, where $0 \le x < 1$, $0 \le y < 1$, and $0 < x+y < 1$. The bottom surface of the groove is situated between the top surface and the second surface of the second semiconductor layer, and the light receiving layer includes an n-type region below an exposed portion of the bottom surface of the groove.

BRIEF DESCRIPTION OF THE DRAWINGS

FIG. 15 is a cross-sectional view illustrating a light detector according to a second embodiment.
FIG. 21 is a diagram illustrating a measurement system used to measure quantum efficiency.

DETAILED DESCRIPTION

Figure 1:
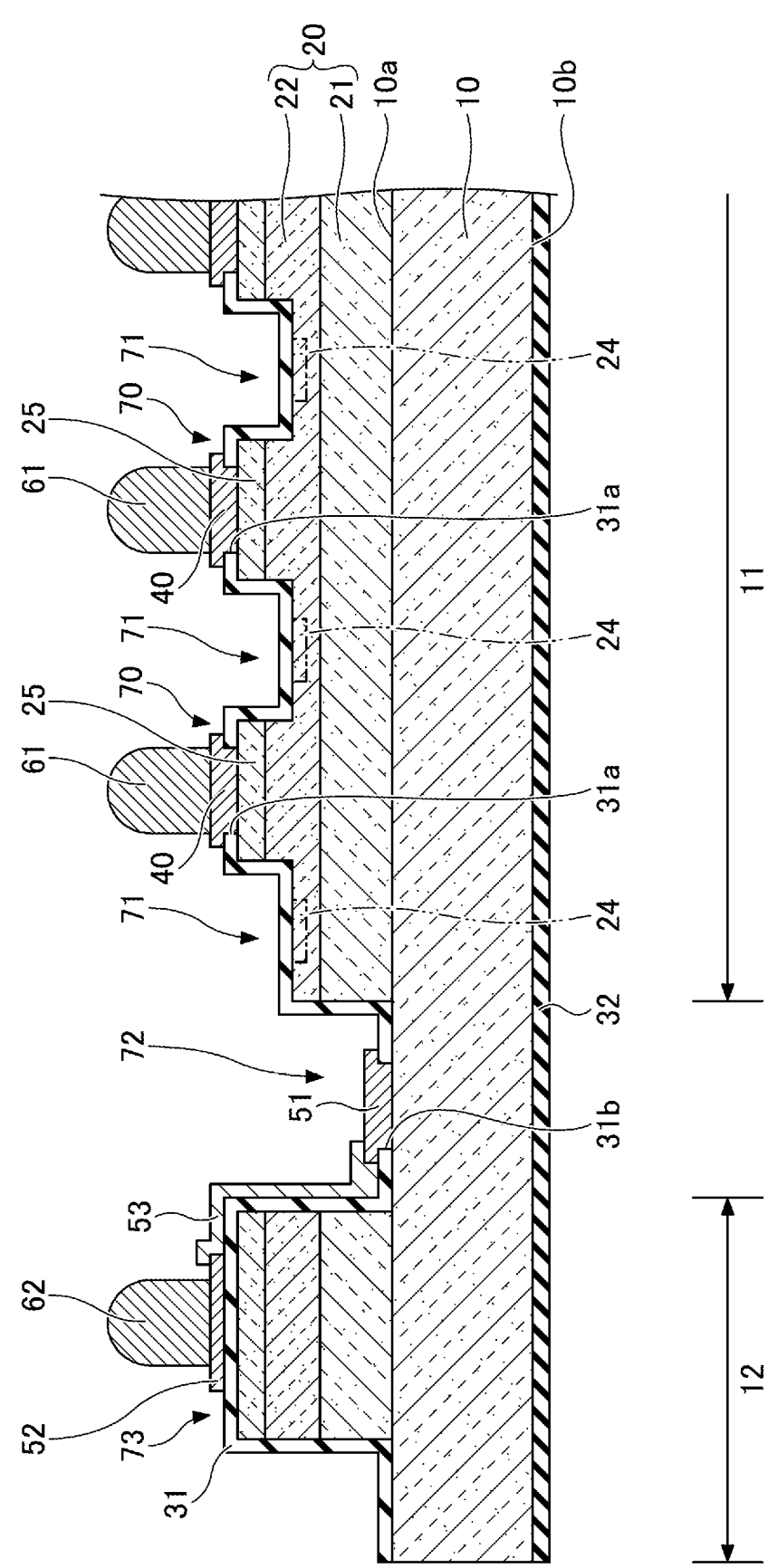
FIG. 1 is a cross-sectional view illustrating a light receiving element according to a first embodiment.

Description of Embodiments of the Present Disclosure

First, embodiments of the present disclosure will be listed and described as follows.

[1] In one aspect of the present disclosure, a light receiving element includes a substrate having a first main surface, and includes a light receiving layer provided on the first main surface. The light receiving layer includes a first semiconductor layer provided on the first main surface, and includes a second semiconductor layer provided on the first semiconductor layer, the second semiconductor layer having a top surface and a bottom surface. The light receiving element includes a contact layer provided on the light receiving layer, and includes a groove that separates the contact layer for each pixel, the groove having a bottom surface. The first semiconductor layer includes a type-II quantum-well layer including an InGaAs layer and a GaAsSb layer. The second semiconductor layer includes a $Al_xGa_yIn_{1-x-y}As$ layer, where $0 \le x < 1$, $0 \le y < 1$, and $0 < x+y < 1$. The bottom surface of the groove is situated between the top surface and the bottom surface of the second semiconductor layer, and the light receiving layer includes an n-type region below an exposed portion of the bottom surface of the groove.

As described below, a light receiving layer includes an n-type region at an exposed portion of a bottom surface of a groove. With this arrangement, crystal leakage is suppressed, thereby enabling reductions in dark current. A first semiconductor layer has high sensitivity in a wavelength range of greater than or equal to 1.0 μm and less than or equal to 2.5 μm, for example.

[2] In [1], a concentration of n-type carriers in an n-type region may be $5 \times 10^{17}$ cm$^{-3}$ or more. In this case, dark current is easily reduced.

[3] In [1] or [2], a thickness of an n-type region may be 0.05 μm or more. In this case, dark current is easily reduced.

[4] In any one of [1] to [3], a distance between an n-type region and a contact layer may be 1.0 μm or more in a plan view perpendicular to a first main surface. In this case, dark current is easily reduced.

[5] In any one of [1] to [4], a substrate may be an n-type InP substrate. In this case, it is easy to enable crystal growth of a first semiconductor layer, a second semiconductor layer, and a contact layer. Further, a voltage can be applied to a light receiving layer between the substrate and the contact layer.

[6] In any one of [1] to [5], an n-type region may include hydrogen as an n-type impurity. When hydrogen is used, an n-type carrier is obtained without performing activation annealing.

[7] In any one of [1] to [6], a light receiving element may further include an antireflective film provided on a second main surface of a substrate opposite a first main surface. As described below, even if a temperature load is applied to a light receiving layer during formation of an antireflective film, an n-type region suppresses an increase in crystal leakage.

[8] In any one of [1] to [7], a second semiconductor layer may include a Ga$_y$In$_{1-y}$As layer, where 0<y<1. In this case, the second semiconductor layer has high sensitivity in a wavelength range of greater than or equal to 1.0 μm and less than or equal to 1.6 μm, for example.

[9] In [8], a second semiconductor layer may include a Ga$_y$In$_{1-y}$As layer provided on the Al$_x$In$_{1-x}$As layer (0<x<1), and a bottom surface of a groove may be situated between a top surface and a bottom surface of the Al$_x$In$_{1-x}$As layer. In this case, a bandgap of the Al$_x$In$_{1-x}$As layer is larger than a bandgap of the Ga$_y$In$_{1-y}$As layer. With this arrangement, surface leakage is easily suppressed.

[10] In [8], a second semiconductor layer may include an InP layer provided on the Ga$_y$In$_{1-y}$As layer, and a bottom surface of a groove may be situated between a top surface and a bottom surface of the InP layer. In this case, a bandgap of the InP layer is larger than a bandgap of the Ga$_y$In$_{1-y}$As layer, and P included in the InP layer is not easily oxidized. With this arrangement, surface leakage is further easily suppressed.

[11] In any one of [1] to [7], a second semiconductor layer may include an Al$_x$In$_{1-x}$As layer (0<x<1). In this case, a bandgap of the Al$_x$In$_{1-x}$As layer is larger than a bandgap of a Ga$_y$In$_{1-y}$As layer. With this arrangement, surface leakage is easily suppressed.

[12] In another aspect of the present disclosure, a light receiving element includes an n-type InP substrate having a first main surface and a second main surface opposite the first main surface, and includes a light receiving layer provided on the first main surface. The light receiving layer includes a first semiconductor layer provided on the first main surface, and includes a second semiconductor layer provided on the first semiconductor layer, the second semiconductor layer having a top surface and a bottom surface. The light receiving element includes a contact layer provided on the light receiving layer, and includes a groove that separates the contact layer for each pixel, the groove having a bottom surface. The light receiving element includes an antireflective film provided on the second main surface. The first semiconductor layer includes a type-II quantum-well layer including an InGaAs layer and a GaAsSb layer. The second semiconductor layer includes a Al$_x$Ga$_y$In$_{1-x-y}$As layer, where 0≤x<1, 0≤y<1, and 0<x+y<1. The bottom surface of the groove is situated between the top surface and the bottom surface of the second semiconductor layer. The light receiving layer includes hydrogen below an exposed portion of the bottom surface of the groove, and includes an n-type region in which a concentration of n-type carriers is $5 \times 10^{17}$ cm$^{-3}$ or more. A thickness of the n-type region is 0.1 μm or more, and a distance between the n-type region and the contact layer is 1.0 μm or more in a plan view perpendicular to the first main surface. In this case, it is particularly easy to reduce dark current.

[13] In still another aspect of the present disclosure, a light detector includes the light receiving element according to any one of [1] to [12], and includes a circuit board coupled to the light receiving element. When the light detector includes the light receiving element, dark current is reduced, thereby obtaining a good signal to noise ratio.

Details of Embodiments of the Present Disclosure

Embodiments of the present disclosure will be described below in detail, but the present disclosure is not limited to the embodiments. In the present specification and the drawings, constituent elements having substantially the same functional configuration are denoted by the same numerals, and redundant description thereof may be omitted.

First, the situation that has led up to one or more embodiments will be described. The inventors of this application have conducted intensive studies to resolve a path of dark current in conventional light receiving elements in which light receiving layers include type-II quantum-well layers. As a result, it has been found that crystal leakage is suppressed before formation of an antireflective film on a substrate, while the crystal leakage is increased after the formation of the antireflective film. When a single absorption layer made of indium gallium arsenide (InGaAs) is used instead of the type-II quantum-well layer, such crystal leakage has not occurred.

The inventors of the application have considered that when the type-II quantum-well layer is used, a temperature load during formation of the antireflective film results in increased crystal leakage. Thus, the inventors have conducted intensive studies to identify contributing factors that change depending on the temperature load. As a result, it has been found that despite impurities not being intentionally introduced into an absorption layer, an amount of hydrogen (H) that is an incidental n-type impurity changes. In other words, it has been found that the amount of hydrogen after formation of the antireflective film is reduced relative to the amount of hydrogen before the formation of the antireflective film. Here, a silicon oxide (SiO$_2$) film is formed so as to cover mesas and grooves for pixel separation, after formation of the mesas and before formation of the antireflective film, and thus hydrogen may be incorporated into the surface layer of the light receiving layer during the formation of the SiO$_2$ film. Further, it has been discovered that, by intentionally providing a region having a high concentration of n-type carriers, in the light receiving layer, crystal leakage can be decreasingly suppressed even after the formation of the antireflective film, thereby enabling reductions in the dark current. Although a mechanism in which crystal leakage is suppressed by the presence of the region having the high concentration of n-type carriers is not determined, it is considered that this is because the presence of n-type carriers changes a band structure of a path in which the crystal leakage occurs, thereby suppressing charge tunneling.

First Embodiment

A first embodiment will be described. The first embodiment relates to the light receiving element. FIG. 1 is a cross-sectional view illustrating the light receiving element according to the first embodiment.

In a light receiving element 100 according to the first embodiment, for example, 256×320 pixels are formed at a pitch of 30 μm. A pixel pitch may be, for example, 50 μm or 90 μm. In the light receiving element 100, for example, 512×640 pixels may be formed, or 32×128 pixels may be formed.

As illustrated in FIG. 1, the light receiving element 100 includes a substrate 10, a light receiving layer 20, a p-type contact layer 25, a passivation film 31, an antireflective film 32, p-type electrodes 40, a first electrode 51, a second electrode 52, a line 53, indium (In) bumps 61, and an In bump 62.

The substrate 10 is, for example, an n-type indium phosphide (InP) substrate. The substrate 10 contains, for example, sulfur (S) in a concentration of about $5 \times 10^{18}$ cm$^{-3}$. The substrate 10 has a first main surface 10a and a second main surface 10b opposite the first main surface 10a. The thickness of the substrate 10 is, for example, about 300 μm. An n-type buffer layer may be provided on the first main surface 10a. The buffer layer is, for example, an InP layer having a thickness of about 0.5 μm. The buffer layer contains, for example, silicon (Si) in a concentration of about $1 \times 10^{18}$ cm$^{-3}$. The light receiving layer 20 and the p-type contact layer 25 are stacked on the first main surface 10a. The antireflective film 32 is provided on the second main surface 10b.

The light receiving layer 20 includes a first semiconductor layer 21 and a second semiconductor layer 22. The first semiconductor layer 21 is provided on the substrate 10, and the second semiconductor layer 22 is provided on the first semiconductor layer 21. The first semiconductor layer 21 is, for example, a type-II quantum-well layer in which indium gallium arsenide (InGaAs) and arsenic gallium antimonide (GaAsSb) are alternately stacked. For example, the thickness of an InGaAs layer is greater than or equal to 2 nm and less than or equal to 6 nm, and the thickness of a GaAsSb layer is greater than or equal to 2 nm and less than or equal to 6 nm. The number of pairs of the InGaAs layer and the GaAsSb layer is, for example, greater than or equal to 100 and less than or equal to 350. For example, a composition of the InGaAs layer included in the first semiconductor layer 21 is $In_{0.53}Ga_{0.47}As$, and a composition of the GaAsSb layer is $GaAs_{0.51}Sb_{0.49}$. The $In_{0.53}Ga_{0.47}As$ and the $GaAs_{0.51}Sb_{0.49}$ are lattice-matched to InP. The second semiconductor layer 22 is, for example, an InGaAs layer. The thickness of the second semiconductor layer 22 is, for example, about 1 μm. For example, the composition of the InGaAs layer included in the second semiconductor layer 22 is $In_{0.53}Ga_{0.47}As$. Even when the composition of the InGaAs layer included in the second semiconductor layer 22 is $In_{1-y}Ga_yAs$ ($0.454 \leq y \leq 0.499$), lattice distortion between the second semiconductor layer 22 and InP can be suppressed to be as small as possible.

The p-type contact layer 25 is, for example, a p-type InGaAs layer. The p-type contact layer 25 contains, for example, zinc (Zn) in a concentration of about $1 \times 10^{19}$ cm$^{-3}$. The thickness of the p-type contact layer 25 is, for example, 0.2 μm. Although an impurity is not intentionally implanted into the second semiconductor layer 22, the second semiconductor layer 22 has a weak n-conductivity type due to incorporation or the like of incidental impurities. With this arrangement, a p-n junction is present between the second semiconductor layer 22 and the p-type contact layer 25.

First grooves 71 for pixel separation, and a second groove 72 through which the substrate 10 is exposed are formed in the p-type contact layer 25 and the second semiconductor layer 22.

Each first groove 71 is formed at portions of the p-type contact layer 25 and the second semiconductor layer 22, and the second semiconductor layer 22 is exposed at the bottom surface of each first groove 71. That is, the bottom surface of the first groove 71 is situated between the top surface and the bottom surface of the second semiconductor layer 22. For each pixel, a mesa 70 is formed by the first groove 71, and pixels are separated. The first groove 71 has a depth of about 0.5 μm, and has a width of about 5 μm. The planar shape of the mesa 70 is, for example, a square having a side length of 20 μm. The second groove 72 is formed at portions of the p-type contact layer 25, the second semiconductor layer 22, the first semiconductor layer 21, and the substrate 10. The substrate 10 is exposed at the bottom surface of the second groove 72. A pixel region 11 and an electrode connection region 12 are separated from each other by the second groove 72. The mesa 70 is formed in the pixel region 11. A mesa 73 is formed in the electrode connection region 12.

A passivation film 31 covers the p-type contact layer 25, the light receiving layer 20, and the substrate 10. The passivation film 31 is, for example, a silicon oxide ($SiO_2$) film. The thickness of the passivation film 31 is, for example, about 0.3 μm. In the passivation film 31, openings 31a through which the p-type contact layer 25 in the respective mesas 70 is exposed, and an opening 31b through which the substrate 10 is exposed between the pixel region 11 and the electrode connection region 12 are formed.

In each of the mesas 70, a p-type electrode 40 is formed on the p-type contact layer 25. The p-type electrode 40 is in contact with the p-type contact layer 25 through the opening 31a. The p-type electrode 40 is constituted, for example, by a metallic film laminate in which a titanium (Ti) layer, a platinum (Pt) layer, and a gold (Au) layer are sequentially laminated.

A first electrode 51 is formed on the substrate 10 between the pixel region 11 and the electrode connection region 12. The first electrode 51 is in contact with the substrate 10 through the opening 31b. On the mesa 73, a second electrode 52 is formed on the p-type contact layer 25. Each of the first electrode 51 and the second electrode 52 is constituted, for example, by a metallic film laminate in which a Ti layer, a Pt layer, and an Au layer are sequentially laminated.

A line 53 couples the first electrode 51 and the second electrode 52. The line 53 is formed on the passivation film 31. The line 53 is constituted, for example, by a metallic film laminate in which a nickel (Ni) layer and an Au layer are sequentially laminated.

The In bumps 61 are respectively provided on the p-type electrodes 40. In each of the pixels in the pixel region 11, the p-type electrode 40 that is circular in plan form is formed on the upper surface of the mesa 70, and the In bump 61 that is circular in plan form is formed on the p-type electrode 40.

In the electrode connection region 12, the In bump 62 is provided on the second electrode 52. The In bump 62 that is circular in plan form is formed on the second electrode 52.

The p-type electrode 40 and the second electrode 52 are respectively coupled to electrodes that are provided on a readout integrated circuit board 300 (see FIG. 15) via the In bumps 61 and 62. The height of each of the In bumps 61 and 62 is, for example, about 10 μm.

The light receiving layer 20 includes n-type regions 24 each of which has an n-conductivity type and that are each situated at the exposed portion of the bottom surface of the first groove 71. The upper surface of the n-type region 24 constitutes at least a portion of the bottom surface of the first groove 71. Each n-type region 24 is formed to have an annular shape so as to surround a corresponding mesa 70 in a plan view. The n-type region 24 contains an n-type impurity to have n-type carriers, for example. The n-type impurity is, for example, hydrogen (H). The n-type region 24 may be provided only in the second semiconductor layer 22, or may be provided in both the first semiconductor layer 21 and the second semiconductor layer 22. The thickness of the n-type region 24 is, for example, 0.05 μm or more. In the plan view, the n-type region 24 is separated from the mesa 70. The n-type regions 24 are formed, for example, by ion implantation into the light receiving layer 20, and impurities are not intentionally implanted into any other regions of the light receiving layer 20. However, an impurity may be incidentally incorporated into a surface layer of the light receiving layer 20 during formation or the like of the passivation film 31. A depth to which an impurity is incidentally incorporated is about 0.1 μm at a maximum. A concentration of n-type carriers in any region other than the n-type regions 24 of the light receiving layer 20 is, for example, $1\times10^{15}$ cm$^{-3}$ or less.

The antireflective film 32 is, for example, a silicon oxynitride (SiON) film. For example, the antireflective film 32 has a refraction index of about 1.8, and has a thickness of about 148 nm.

Hereinafter, a method for manufacturing the light receiving element 100 according to the first embodiment will be described. FIGS. 2 to 9 are cross-sectional views illustrating the method of manufacturing the light receiving element according to the first embodiment.

Figure 2:
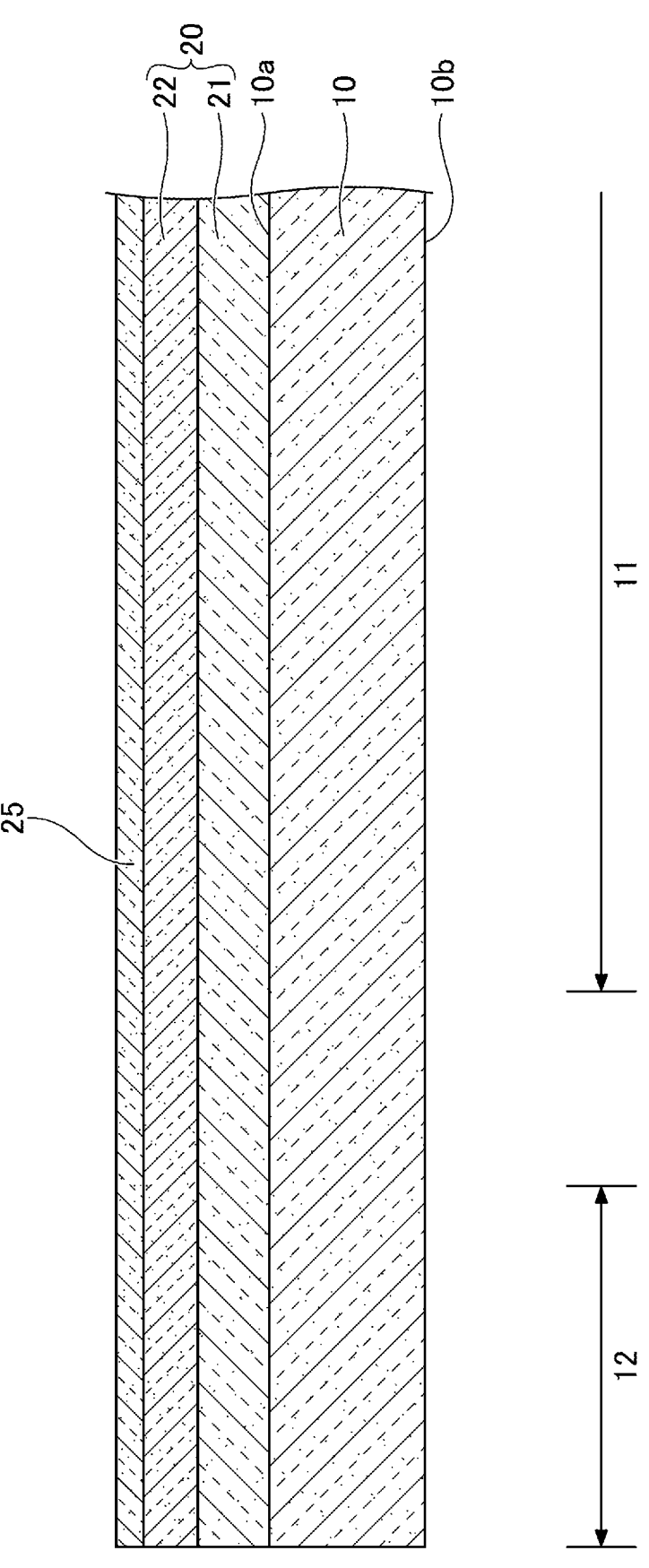
FIG. 2 is a cross-sectional view (part 1) illustrating a method for manufacturing the light receiving element according to the first embodiment.

First, as illustrated in FIG. 2, the first semiconductor layer 21, the second semiconductor layer 22, and the p-type contact layer 25 are sequentially formed on the first main surface 10a of the substrate 10, by epitaxial growth. As the epitaxial growth of the compound semiconductor layer as described above, metal organic vapor phase epitaxy (MOVPE) is used. The thickness of the substrate 10 is, for example, about 350 μm. An n-type buffer layer may be formed on the first main surface 10a of the substrate 10, before forming the first semiconductor layer 21.

Figure 3:
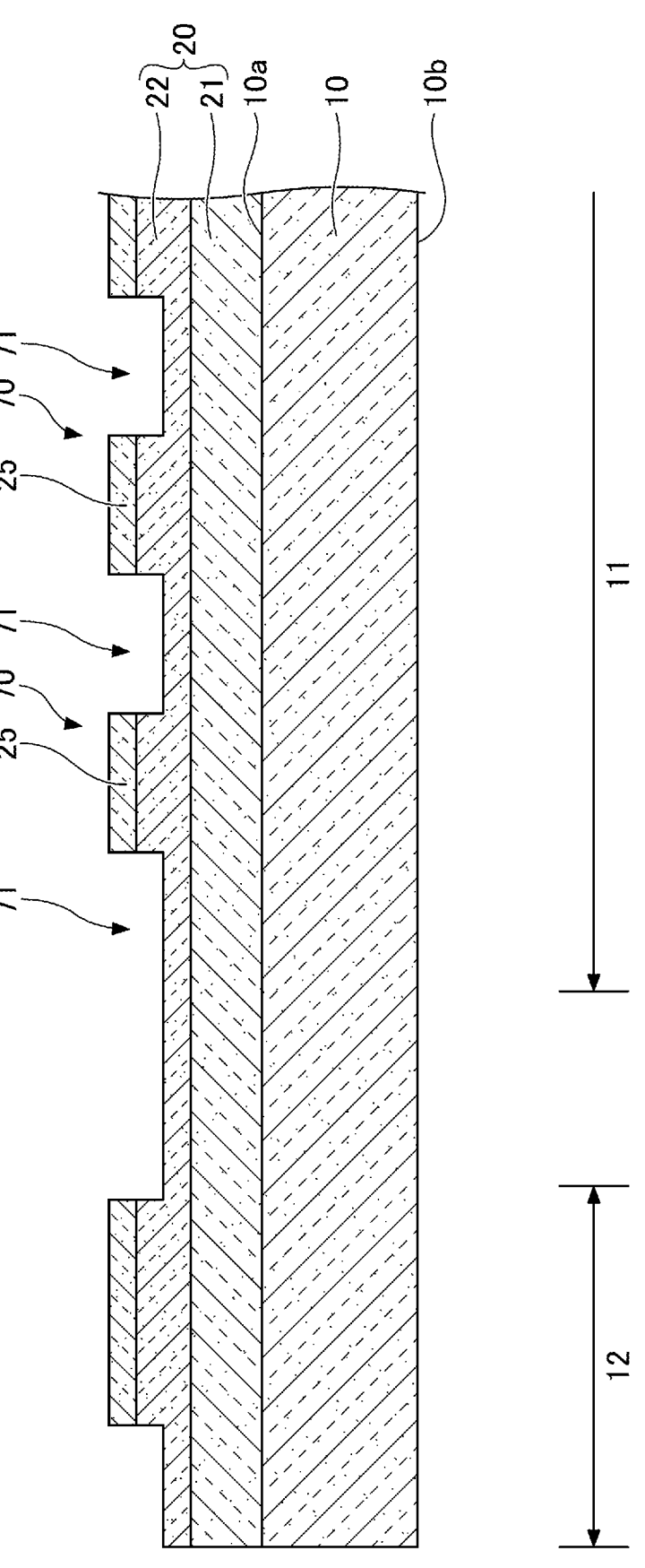
FIG. 3 is a cross-sectional view (part 2) illustrating the method for manufacturing the light receiving element according to the first embodiment.

Then, as illustrated in FIG. 3, first grooves 71 for pixel separation are formed. Specifically, a silicon nitride (SiN) film, not illustrated, having a film thickness of 0.5 μm is deposited on the p-type contact layer 25 by plasma chemical vapor deposition (CVD), then a photoresist is applied onto the deposited SiN film, and subsequently exposure and development are performed using an exposure device to form a resist pattern (not illustrated). The resist pattern has openings in regions where the respective first grooves 71 are to be formed, and the SiN film in the openings of the resist pattern is removed by wet etching in which buffered hydrofluoric acid is used, to thereby form a mask of the SiN film. Then, the resist pattern (not illustrated) is removed by an organic solvent or the like. Thereafter, portions of the p-type contact layer 25 and the second semiconductor layer 22 in the regions from which the SiN film is removed are removed by dry etching such as reactive ion etching (RIE). In the RIE, a gas mixture, for example, of silicon tetrachloride (SiCl$_4$) gas and argon (Ar) gas is used. With this approach, the first grooves 71 for pixel separation are formed. The respective mesas 70 are formed upon forming the first grooves 71, and thus pixels are separated. Likewise, in such a process, a compound semiconductor layer is removed in a region where the second groove 72 described below is to be formed. Thereafter, the SiN film (not illustrated) is removed by buffered hydrofluoric acid.

Figure 4:
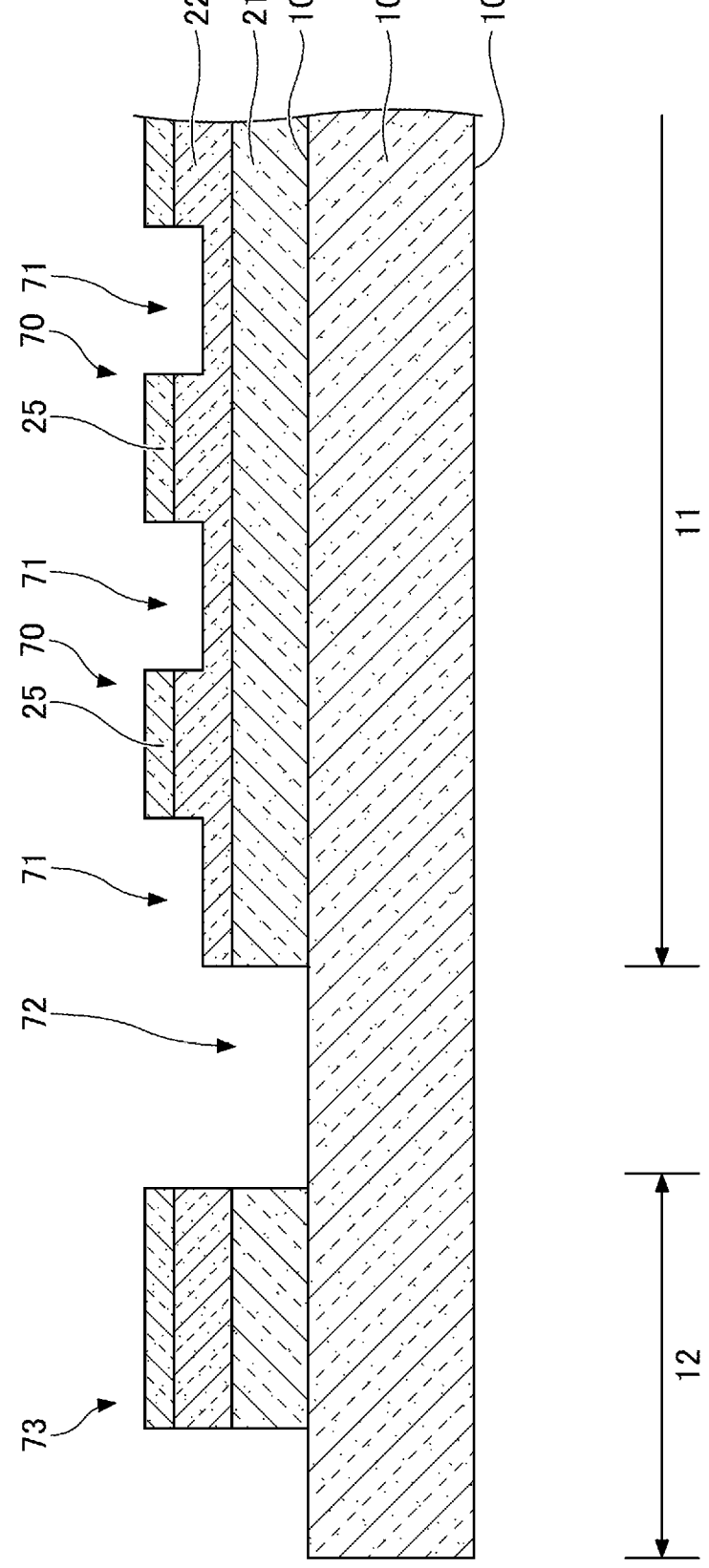
FIG. 4 is a cross-sectional view (part 3) illustrating the method for manufacturing the light receiving element according to the first embodiment.

Then, as illustrated in FIG. 4, the second groove 72 is formed along the perimeter of the substrate 10. Specifically, a SiN film, not illustrated, having a film thickness of 0.5 μm is deposited on the p-type contact layer 25 and the like by plasma CVD, then a photoresist is applied onto the deposited SiN film, and subsequently exposure and development are performed using an exposure device, to thereby form a resist pattern (not illustrated). The resist pattern has an opening in a region where the second groove 72 is to be formed, and the SiN film in the opening of the resist pattern is removed by wet etching in which buffered hydrofluoric acid is used, to thereby form a mask of the SiN film. Then, the resist pattern (not illustrated) is removed by an organic solvent or the like, and further portions of the second semiconductor layer 22, the first semiconductor layer 21, and the substrate 10 in a region from which the SiN film is removed are removed by dry etching such as RIE, so that the surface of the substrate 10 is exposed. Thereafter, the SiN film (not illustrated) is removed by buffered hydrofluoric acid. With this approach, the second groove 72 is formed, and the mesa 73 is formed outside the second groove 72 when viewed from the mesas 70.

In dry etching, a compound semiconductor layer is damaged. For this reason, after forming the second groove 72, dry etching is performed to remove a damaged portion. In the dry etching, for example, a mixing solution is used, where a mass ratio of sulfuric acid:hydrogen peroxide solution:water=1:1:60.

Figure 5:
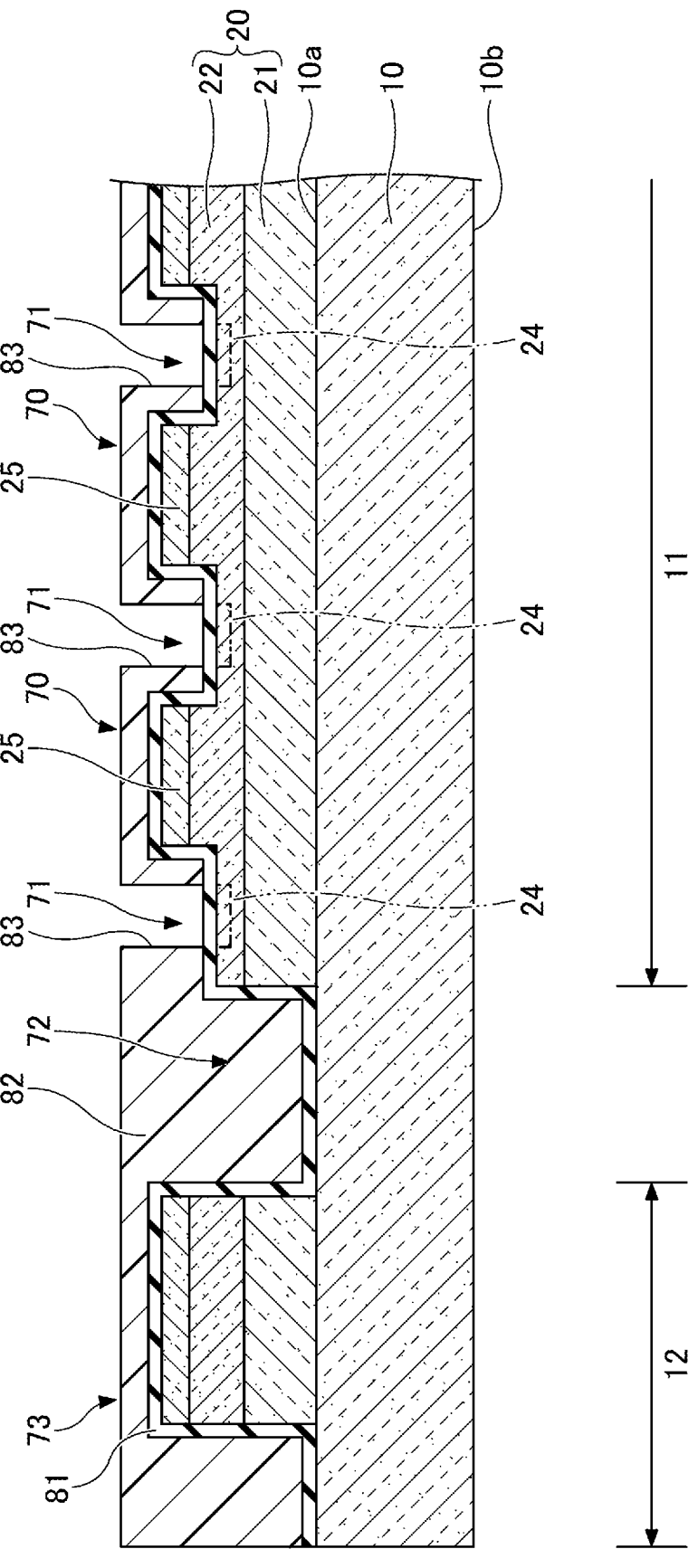
FIG. 5 is a cross-sectional view (part 4) illustrating the method for manufacturing the light receiving element according to the first embodiment.

Then, as illustrated in FIG. 5, a SiO$_2$ film 81 having a thickness of 0.3 μm is formed so as to cover the p-type contact layer 25, the light receiving layer 20, and the substrate 10. Subsequently, a photoresist is applied onto the SiO$_2$ film 81, and then exposure and development are performed using an exposure device to form a resist pattern 82. The thickness of the resist pattern 82 is, for example, about 3 μm. The resist pattern 82 has openings 83 in regions where the n-type regions 24 are to be formed.

Then, with use of the resist pattern 82 as a mask for ion implantation that is selected, hydrogen ions are implanted to form the n-type regions 24 in the light receiving layer 20. For example, a dose of hydrogen ions is $3\times10^{15}$ cm$^{-2}$, and accelerating voltage is 46 keV. The SiO$_2$ film 81 suppresses surface roughening of the p-type contact layer 25, the second semiconductor layer 22, and the substrate 10, during ion implantation.

Figure 6:
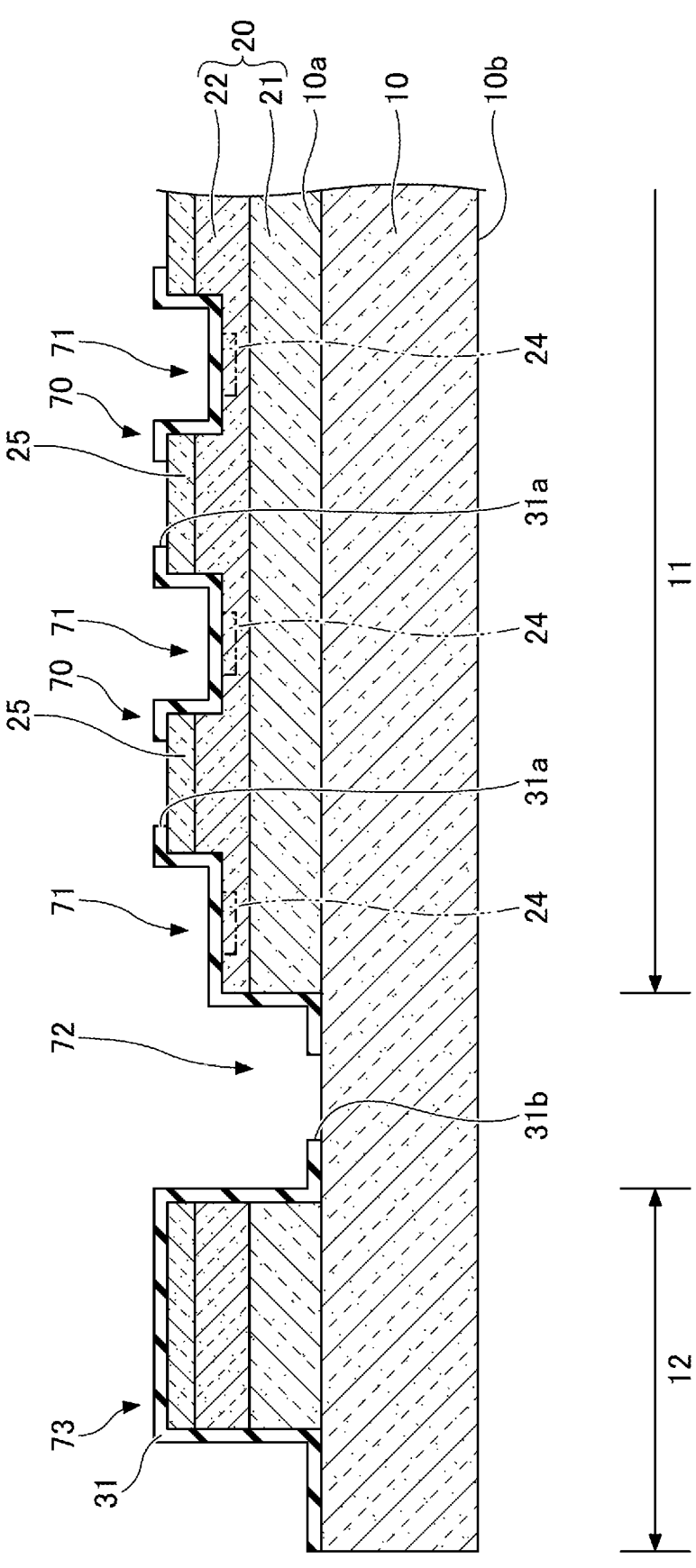
FIG. 6 is a cross-sectional view (part 5) illustrating the method for manufacturing the light receiving element according to the first embodiment.

Then, as illustrated in FIG. 6, the resist pattern 82 and the SiO$_2$ film 81 are removed. Subsequently, the passivation film 31 is formed. Specifically, the SiO$_2$ film, not illustrated, is deposited on the entire surface by plasma CVD, then a photoresist is applied onto the deposited SiO$_2$ film, and subsequently exposure and development are performed using an exposure device to form a resist pattern (not illustrated). The $SiO_2$ film is formed at a substrate temperature of 150° C., for example. The resist pattern has openings in regions where the p-type electrodes 40 are to be formed and a region where the first electrode 51 is to be formed, and the $SiO_2$ film in the openings of the resist pattern is removed by dry etching such as RIE. As a result, the passivation film 31 that has (i) openings 31a through which the p-type contact layer 25 of the mesas 70 is exposed and (ii) an opening 31b through which the surface of the substrate 10 is exposed is formed.

Figure 7:
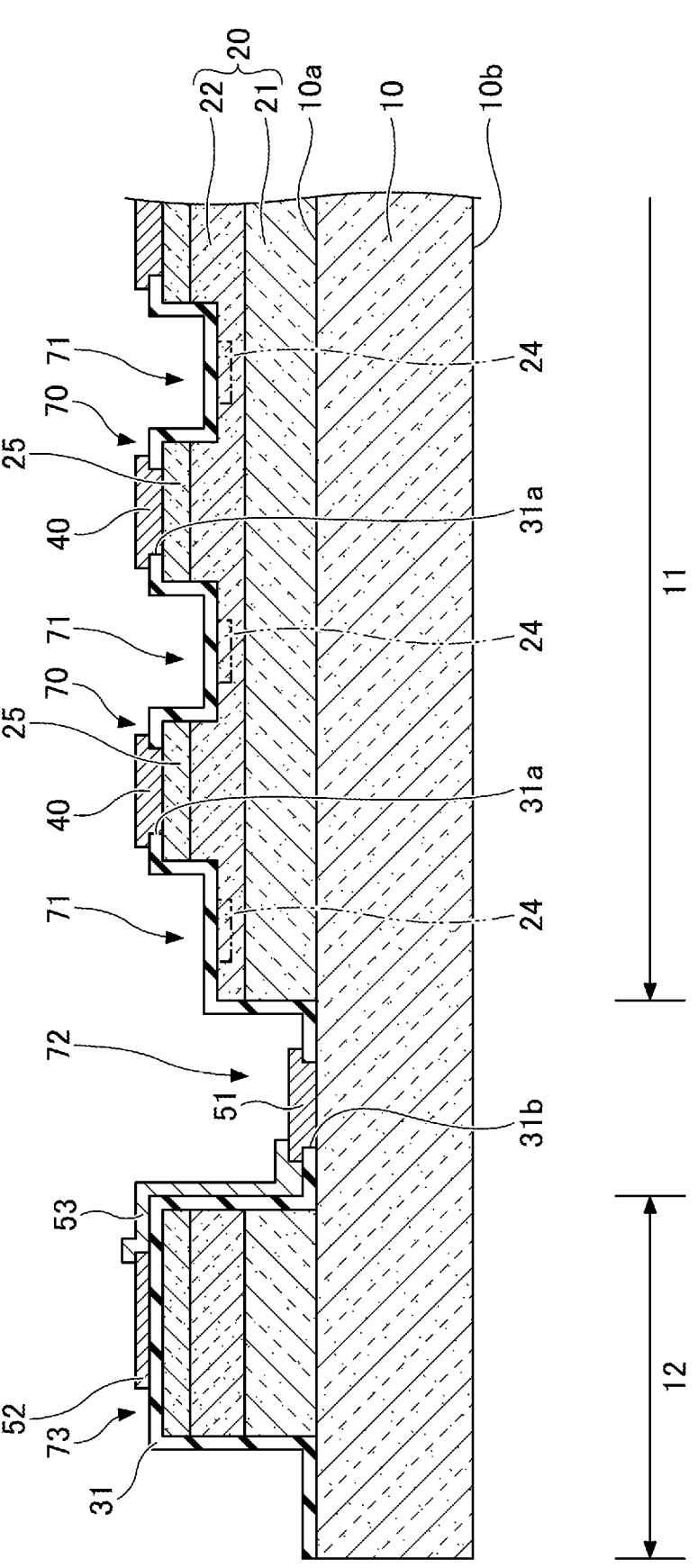
FIG. 7 is a cross-sectional view (part 6) illustrating the method for manufacturing the light receiving element according to the first embodiment.

Then, as illustrated in FIG. 7, the p-type electrodes 40 are formed on the p-type contact layer 25, the first electrode 51 is formed on the substrate 10, and the second electrode 52 is formed above the mesa 73 via the passivation film 31. The p-type electrodes 40, the first electrode 51, and the second electrode 52 are formed by a lift-off method. Specifically, a resist pattern (not illustrated) having openings in regions where the p-type electrodes 40, the first electrodes 51, and the second electrode 52 are to be formed is formed. Then, a metallic film laminate in which a Ti layer, a Pt layer, and an Au layer are sequentially laminated by electron beam (EB) deposition is deposited, and subsequently the metallic film laminate is immersed in an organic solvent or the like. As a result, the metallic film laminate on the resist pattern is removed together with the resist pattern, and thus the p-type electrodes 40, the first electrode 51, and the second electrode 52 are formed from the remaining metallic film laminate.

Further, a line 53 to couple the first electrode 51 and the second electrode 52 is formed by a lift-off method. Specifically, a resist pattern (not illustrated) having an opening in a region where the line 53 is to be formed is formed, then a metallic film laminate in which a Ni layer and an Au layer are sequentially laminated is deposited by EB vapor deposition, and subsequently the metallic film laminate is immersed in an organic solvent or the like. As a result, the metallic film laminate on the resist pattern is removed together with the resist pattern, and the line 53 is formed from the remaining metallic film laminate.

Figure 8:
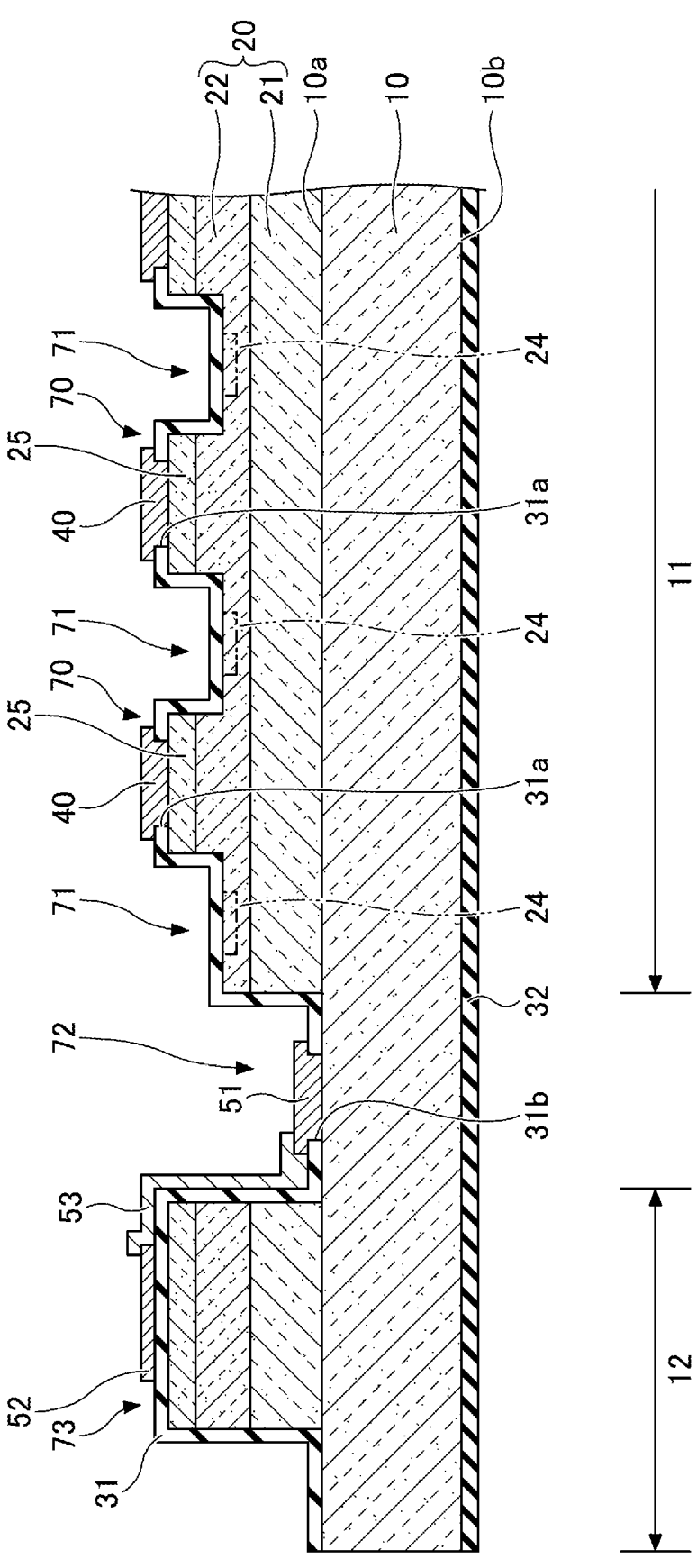
FIG. 8 is a cross-sectional view (part 7) illustrating the method for manufacturing the light receiving element according to the first embodiment.

Then, as illustrated in FIG. 8, the second main surface 10b of the substrate 10 is polished to become a mirror surface. Subsequently, the antireflective film 32 is formed on the second main surface 10b. The antireflective film 32 is formed by plasma CVD. The antireflective film 32 is formed at a substrate temperature of 200° C., for example. A time period required to form the antireflective film 32 is, for example, about 40 minutes.

Figure 9:
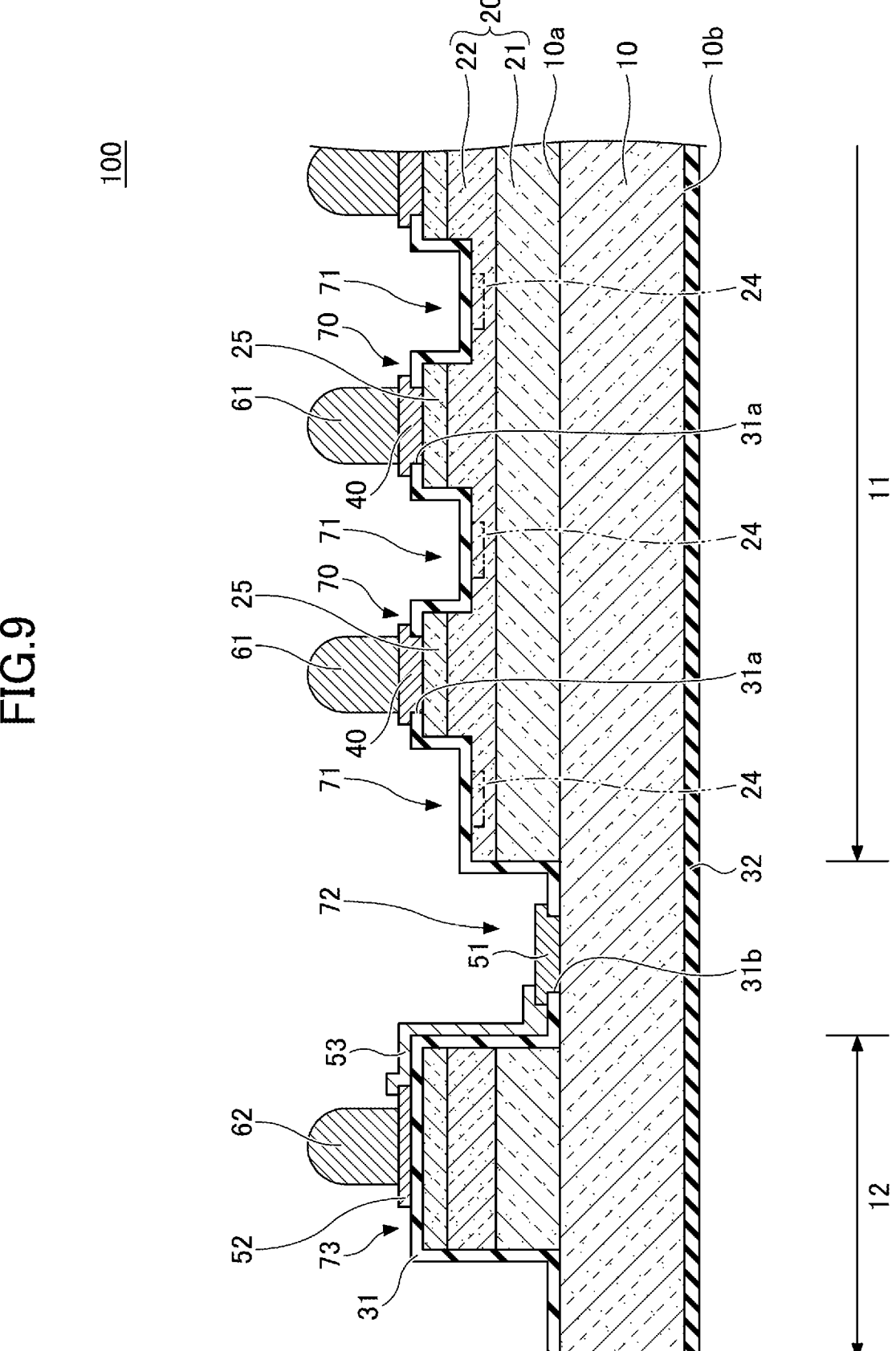
FIG. 9 is a cross-sectional view (part 8) illustrating the method for manufacturing the light receiving element according to the first embodiment.

Then, as illustrated in FIG. 9, In bumps 61 are formed on the p-type electrodes 40, and an In bump 62 is formed on the second electrode 52. The In bumps 61 and 62 are formed by a lift-off method. Thereafter, division into chips is enabled to form the light receiving element 100.

With this approach, the light receiving element 100 according to the first embodiment can be manufactured.

In the light receiving element 100 according to the first embodiment, the light receiving layer 20 includes the n-type regions 24 each of which has an n-conductivity type and that are each situated at an exposed portion of the bottom surface of the first groove 71. With this arrangement, even if the n-type impurity that is incidentally contained in the light receiving layer 20 is reduced during formation of the antireflective film 32, a sufficient amount of the n-type impurity is present in the light receiving layer 20, and thus crystal leakage can be suppressed. Therefore, in the first embodiment, dark current can be reduced.

The first semiconductor layer 21 has high sensitivity, for example, in a wavelength range of greater than or equal to 1.0 μm and less than or equal to 2.5 μm, and the second semiconductor layer 22 has high sensitivity, for example, in a wavelength range of greater than or equal to 1.0 μm and less than or equal to 1.6 μm.

By use of an n-type InP substrate as the substrate 10, crystal growth of the first semiconductor layer 21, the second semiconductor layer 22, and the p-type contact layer 25 is facilitated. Further, a voltage can be applied to the light receiving layer 20 that is between the substrate 10 and the p-type contact layer 25.

The concentration of n-type carriers in each n-type region 24 may be $5 \times 10^{17}$ cm$^{-3}$ or more, may be $1 \times 10^{18}$ cm$^{-3}$ or more, or may be $1 \times 10^{19}$ cm$^{-3}$ or more. When a concentration of n-type carriers is extremely low, it may be difficult to obtain the effect of suppressing the dark current. For example, when the concentration of n-type carriers is $5 \times 10^{17}$ cm$^{-3}$ or more, it is easy to reduce the dark current to 5 pA or less. The concentration of n-type carriers can be measured, for example, by CV measurement.

The thickness of each n-type region 24 may be 0.05 μm or more, may be 0.1 μm or more, or may be 0.4 μm or more. If the n-type region 24 is extremely thin, it may be difficult to obtain the effect of suppressing the dark current. In this description, the thickness of the n-type region 24 refers to a thickness of the region where a concentration of n-type carriers is $1 \times 10^{15}$ cm$^{-3}$ or more.

Figure 10:
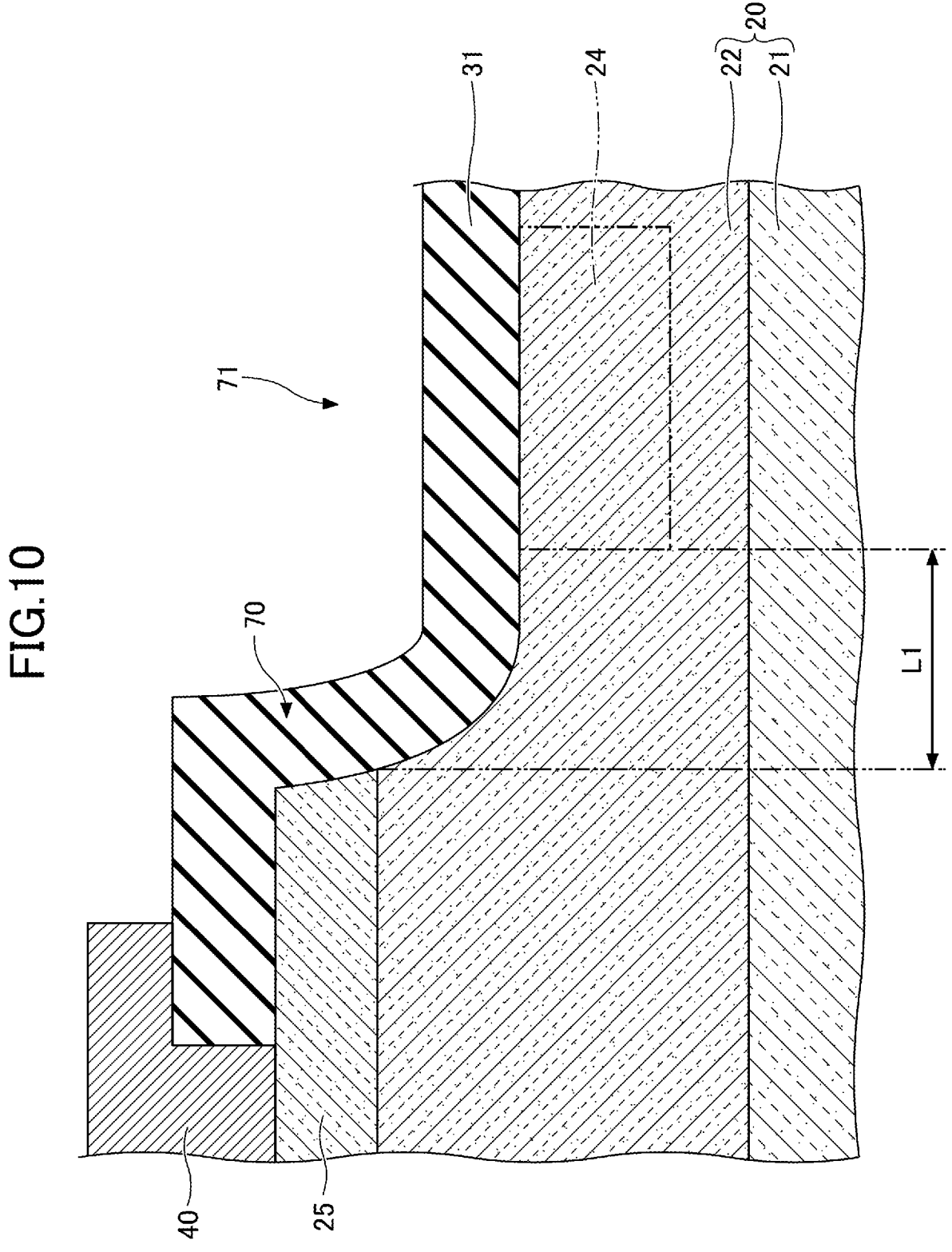
FIG. 10 is a cross-sectional view illustrating an example of a detailed structure of a mesa.

In a plan view perpendicular to the first main surface 10a, a distance Li between the n-type region 24 and the p-type contact layer 25 may be 1.0 μm or more, may be 1.2 μm or more, or may be 1.5 μm or more. If the distance Li between the n-type region 24 and the p-type contact layer 25 is extremely short, it may be difficult to obtain the effect of suppressing the dark current. As illustrated in FIG. 10, a side surface of the mesa 70 may be curved. FIG. 10 is a cross-sectional view illustrating an example of a detailed structure of the mesa 70.

Hereinafter, various tests that the inventors of this application have conducted will be described.

(First Test)

Figure 11:
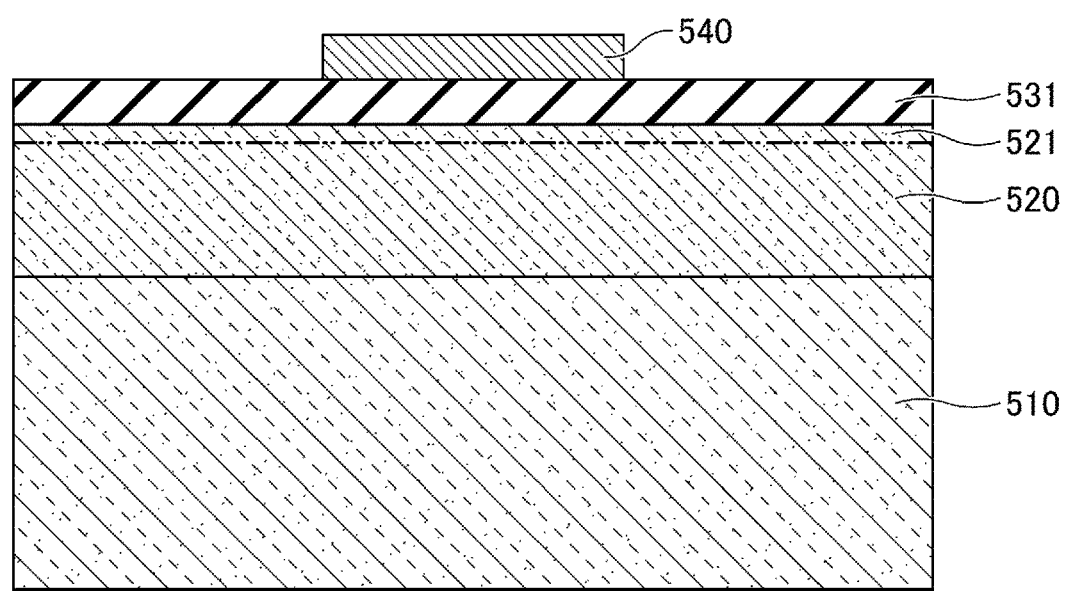
FIG. 11 is a cross-sectional view illustrating a simulated sample.
Figure 12:
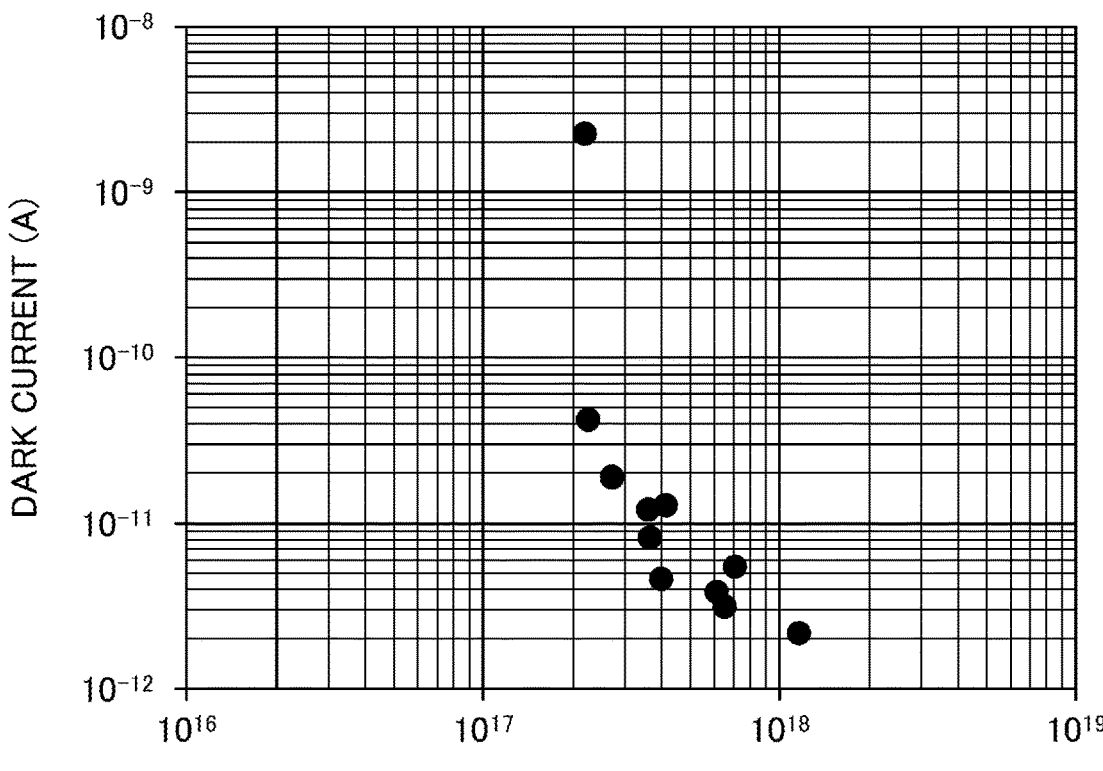
FIG. 12 is a graph illustrating the relationship between a concentration of n-type carriers and dark current.

In a first test, the relationship between the concentration of n-type carriers and the dark current was checked. In the first test, a plurality of samples were fabricated, where a different concentration of n-type carriers in the light receiving layer 20 was set for each sample, by changing a formation condition of a $SiO_2$ film that serves as the passivation film 31, and by performing or not performing heat treatment after formation of the mesa 70. The temperature of the heat treatment was 200° C., and the heat treatment time was 4 minutes. In this test, an n-type region 24 was not formed. Then, for each sample, dark current was measured at a temperature of 213 K under a condition in which a voltage of −1.2 V was applied between the p-type electrode 40 and the second electrode 52. In order to measure a concentration of n-type carriers, without performing a measurement directly on any sample, a simulated sample illustrated in FIG. 11 was fabricated, as in each sample. That is, the simulated sample illustrated in FIG. 11 was fabricated under the same condition as the formation condition of the $SiO_2$ film, based on whether heat treatment was performed. Then, a concentration of n-type carriers for the simulated sample was measured by cyclic voltammetry (CV). The simulated sample includes a substrate 510 corresponding to the substrate 10, an InGaAs layer 520 on the substrate 10, a passivation film 531 on the InGaAs layer 520, and an electrode 540 on the passivation film 531. The concentration of n-type carriers corresponds to a concentration of n-type carriers in a region 521 that extends from an interface between the InGaAs layer 520 and the passivation film 531, to a level that is 0.1 μm deeper than the interface. The test results are illustrated in FIG. 12. FIG. 11 is a cross-sectional view illustrating the simulated sample. FIG. 12 is a graph illustrating the relationship between the concentration of n-type carriers and the dark current.

As illustrated in FIG. 12, the dark current is increased in accordance with a decreasing concentration of n-type carriers. In the first test, when the concentration of n-type carriers was $5 \times 10^{17}$ cm$^{-3}$, the dark current was 5 pA.

(Second Test)

Figure 13:
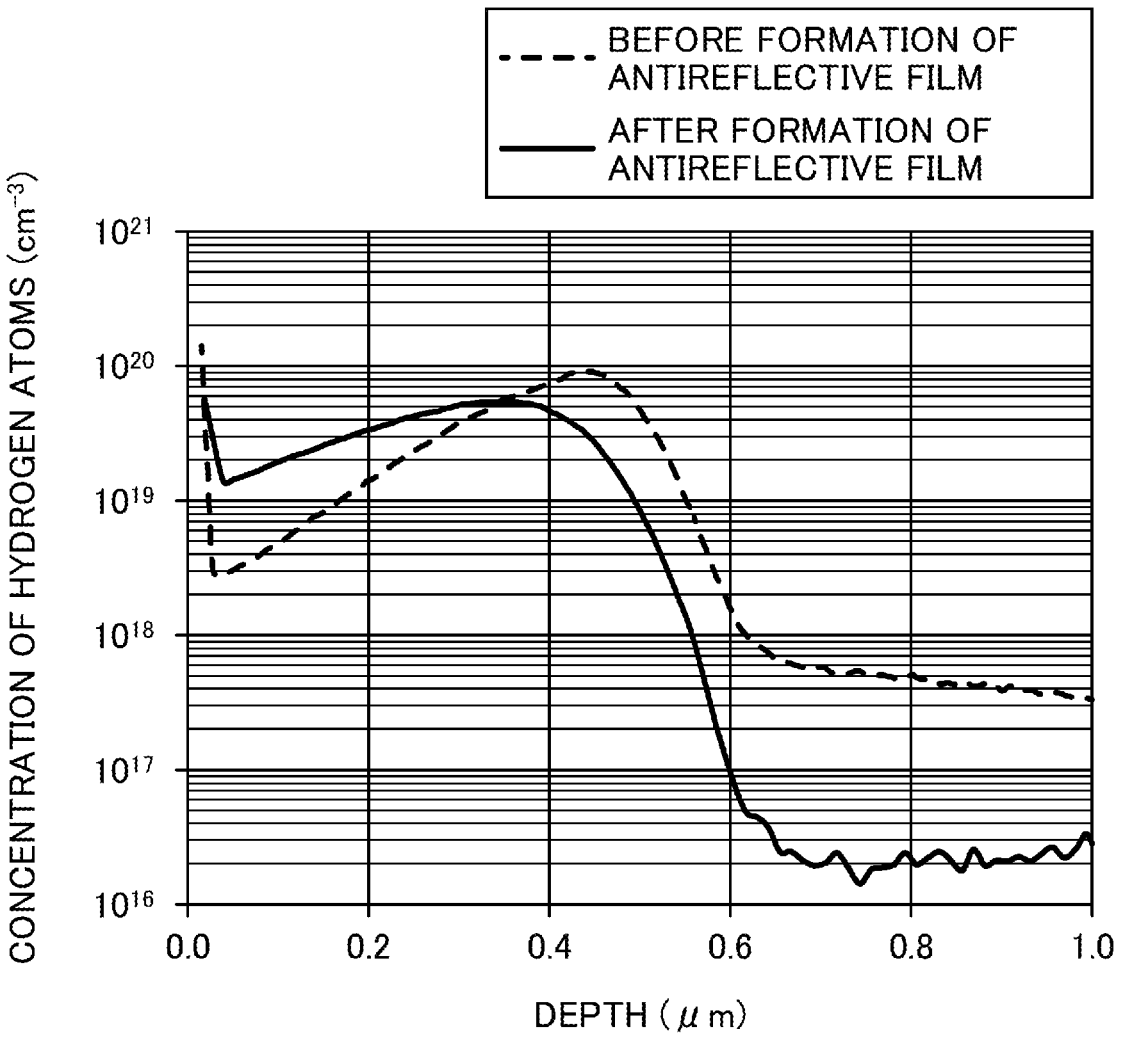
FIG. 13 is a graph illustrating a measurement result for a concentration profile of hydrogen atoms.
Figure 14:
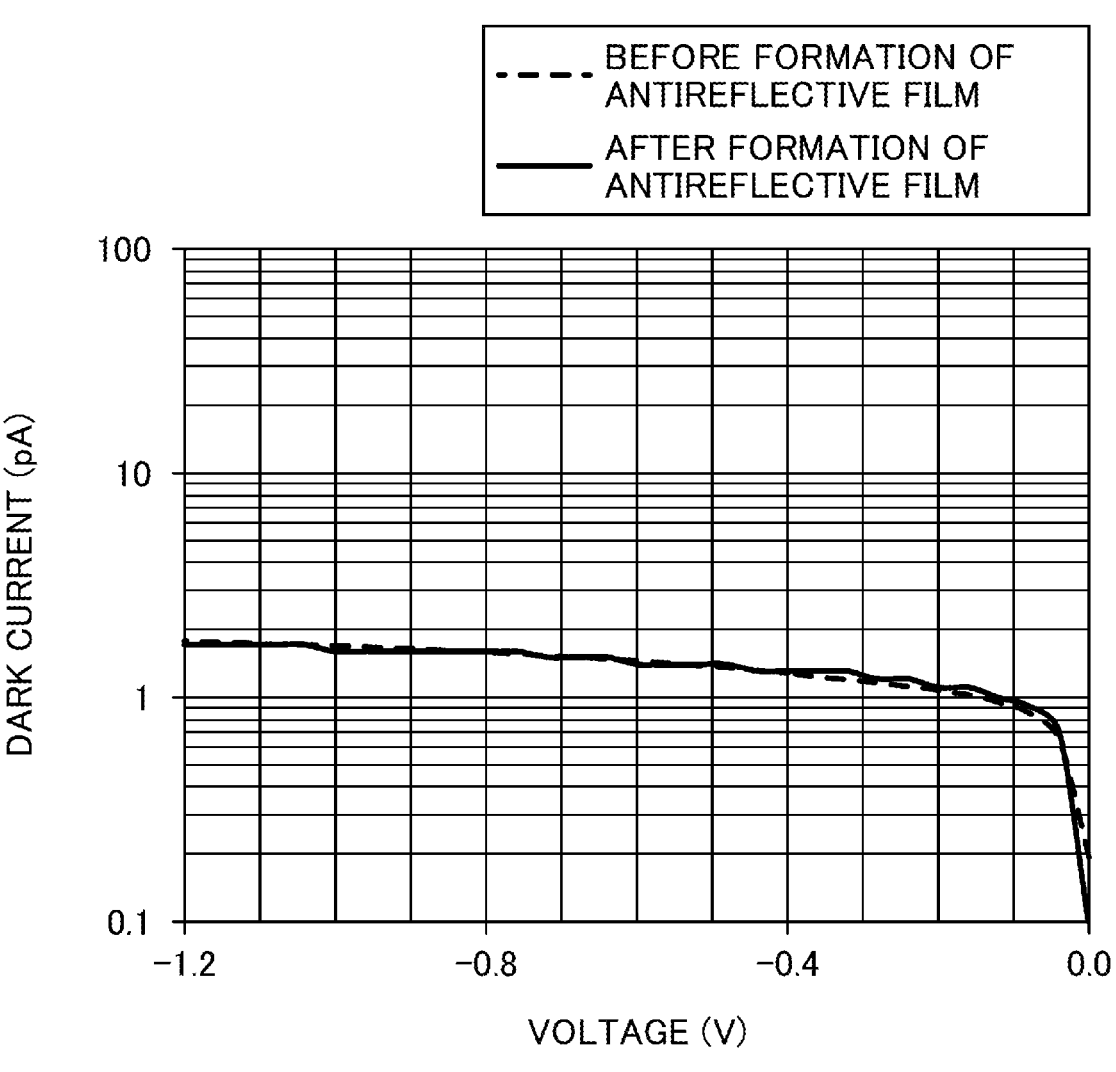
FIG. 14 is a graph illustrating a measurement result for dark current.

In a second test, a sample was fabricated under the condition described in the first embodiment. Then, the sample was used to measure a concentration profile of hydrogen atoms in the n-type region 24 and to measure dark current, before and after formation of the antireflective film 32. The thickness of the second semiconductor layer 22 was 0.8 μm, the thickness of the p-type contact layer 25 was 0.2 μm, the thickness of the n-type region 24 was 0.5 μm, and the thickness of the passivation film 31 was 0.3 μm. When forming the n-type region 24, a dose was $3 \times 10^{15}$ cm$^{-2}$, and accelerating voltage was 46 keV. The concentration profile of hydrogen atoms was measured by secondary ion mass spectrometry (SIMS). The dark current was measured at a temperature of 213 K. The test results are illustrated in FIGS. 13 and 14. FIG. 13 is a graph illustrating measurement results for the concentration profile of hydrogen atoms. FIG. 14 is a graph illustrating the measurement results for the dark current.

As illustrated in FIG. 13, the concentration profile of hydrogen atoms changes before and after formation of the antireflective film 32. The hydrogen atoms are present in a high concentration in the n-type region 24 even after the formation of the antireflective film 32. As illustrated in FIG. 14, the magnitude of the dark current hardly changes before and after the formation of the antireflective film 32.

From the results in the first test and the second test, it is confirmed that the dark current is suppressed in the first embodiment.

The impurity used to form the n-type region 24 is not limited to hydrogen. For example, sulfur (S) or silicon (Si) may be used. In this regard, when hydrogen is used, n-type carriers are obtained without performing activation annealing. In contrast, when sulfur or silicon is used, n-type carriers are not obtained without performing activation annealing. The activation annealing may result in increased surface leakage. For this reason, the impurity used to form the n-type region 24 is, for example, hydrogen.

Second Embodiment

Figure 15:
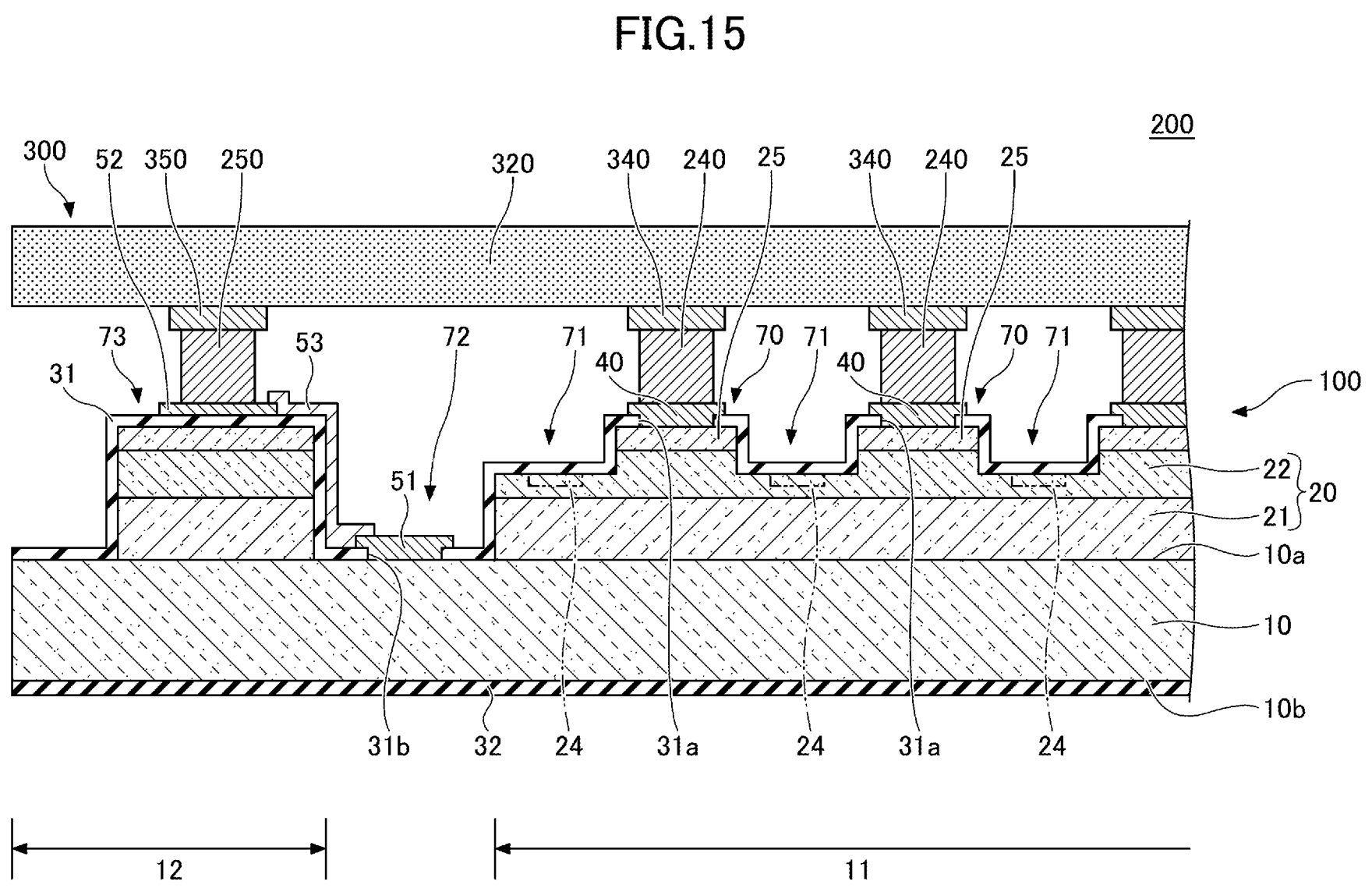

Hereinafter, a second embodiment will be described. The second embodiment relates to a light detector including the light receiving element 100 according to the first embodiment. FIG. 15 is a cross-sectional view illustrating the light detector according to the second embodiment.

A light detector 200 according to the second embodiment includes the light receiving element 100 and a readout integrated circuit (ROIC) board 300. The readout integrated circuit board 300 includes a wiring substrate 320, pixel electrodes 340, and a common electrode 350. The pixel electrodes 340 and the common electrode 350 are arranged on one surface of the wiring substrate 320. The readout integrated circuit board 300 includes a circuit that reads out a signal that is output from the light receiving element 100.

The circuit includes, for example, a multiplexer. The readout integrated circuit board 300 is an example of a circuit board.

The light detector 200 further includes connection members 240 each of which connects the p-type electrode 40 and the pixel electrode 340, and includes a connection member 250 that connects the second electrode 52 and the common electrode 350. The connection member 240 includes the In bumps 61, and includes In bumps that are respectively provided on the pixel electrodes 340 of the readout integrated circuit board 300 before bonding of the readout integrated circuit board 300. The connection member 250 includes the In bump 62, and includes an In bump that is provided on the common electrode 350 of the readout integrated circuit board 300 before bonding of the readout integrated circuit board 300.

According to the second embodiment, dark current through the light receiving element 100 is suppressed, and an excellent signal to noise ratio is obtained.

Third Embodiment

Figure 16:
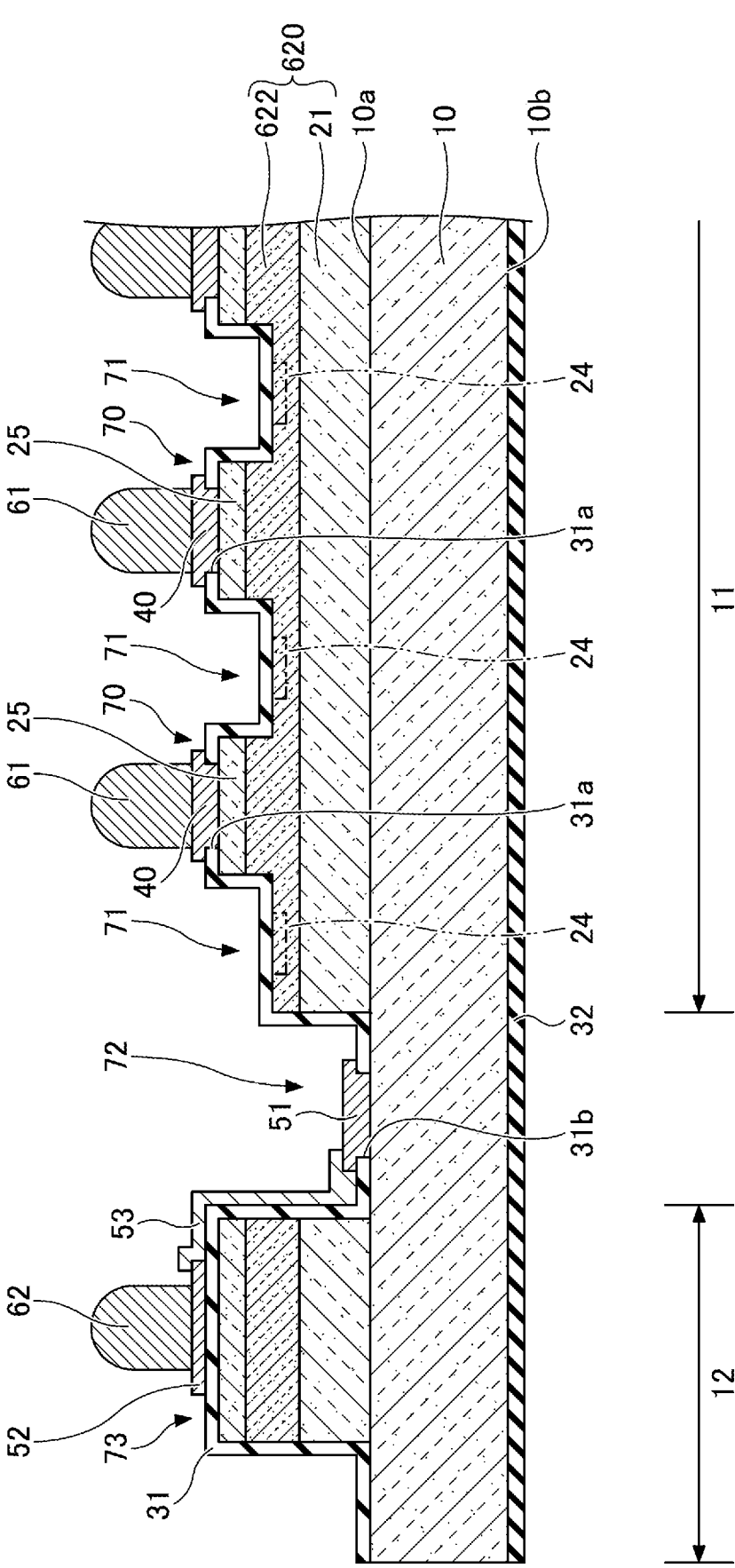
FIG. 16 is a cross-sectional view illustrating the light receiving element according to a third embodiment.

Hereinafter, a third embodiment will be described. The third embodiment differs from the first embodiment mainly in the configuration of the light receiving layer. FIG. 16 is a cross-sectional view illustrating the light receiving element according to the third embodiment.

A light receiving element 600 according to the third embodiment includes a light receiving layer 620, instead of the light receiving layer 20. The light receiving layer 620 includes the first semiconductor layer 21 and a second semiconductor layer 622. The second semiconductor layer 622 is, for example, an AlInAs layer. The thickness of the second semiconductor layer 622 is, for example, about 1 μm. For example, a composition of the AlInAs layer included in the second semiconductor layer 622 is $Al_{0.47}In_{0.53}As$. Even when the composition of the AlInAs layer included in the second semiconductor layer 622 is $Al_xIn_{1-x}As$ ($0.4645 \leq x \leq 0.509$), lattice distortion between the second semiconductor layer 622 and InP can be suppressed to be as small as possible.

Each first groove 71 is formed in portions of the p-type contact layer 25 and the second semiconductor layer 622. The second semiconductor layer 622, e.g., an AlInAs layer, is exposed at the bottom surfaces of the first grooves 71. That is, the bottom surfaces of the first grooves 71 are disposed at the second semiconductor layer 622. The n-type regions 24 may be provided only in the second semiconductor layer 622, or may be provided in both the first semiconductor layer 21 and the second semiconductor layer 622.

Although an impurity is not intentionally implanted into the second semiconductor layer 622, the second semiconductor layer 622 has a weak n-conductivity type due to incorporation or the like of incidental impurities. With this arrangement, a p-n junction is present between the second semiconductor layer 622 and the p-type contact layer 25.

Other configurations in the third embodiment are the same as those described in the first embodiment.

In the light receiving element 600 according to the third embodiment, the light receiving layer 620 includes the n-type regions 24 each of which has an n-concentration type and that are each situated in the exposed portion of the bottom surface of the first groove 71. The upper surface of each n-type region 24 constitutes at least a portion of the bottom surface of the first groove 71. With this arrangement, even when an n-type impurity that is incidentally contained in the light receiving layer 620 is reduced during formation of the antireflective film 32, a sufficient amount of the n-type impurity is present in the light receiving layer 620, and thus crystal leakage can be suppressed. Therefore, dark current can be reduced in the third embodiment.

In addition, according to the third embodiment, the second semiconductor layer 622 includes an AlInAs layer, and a bandgap of AlInAs is larger than a bandgap of InGaAs. For example, in performing a comparison using a composition that is lattice-matched to InP, the bandgap of $In_{0.53}Ga_{0.47}As$ is 0.73 eV, while the bandgap of $Al_{0.47}In_{0.53}As$ is 1.42 eV. With this arrangement, in the third embodiment, surface leakage can be further suppressed compared to the first embodiment. The surface leakage in the dark current is likely to increase in accordance with a decreasing number of pixels. Therefore, in the third embodiment, a significant effect is obtained in accordance with a decreasing number of pixels.

Fourth Embodiment

Figure 17:
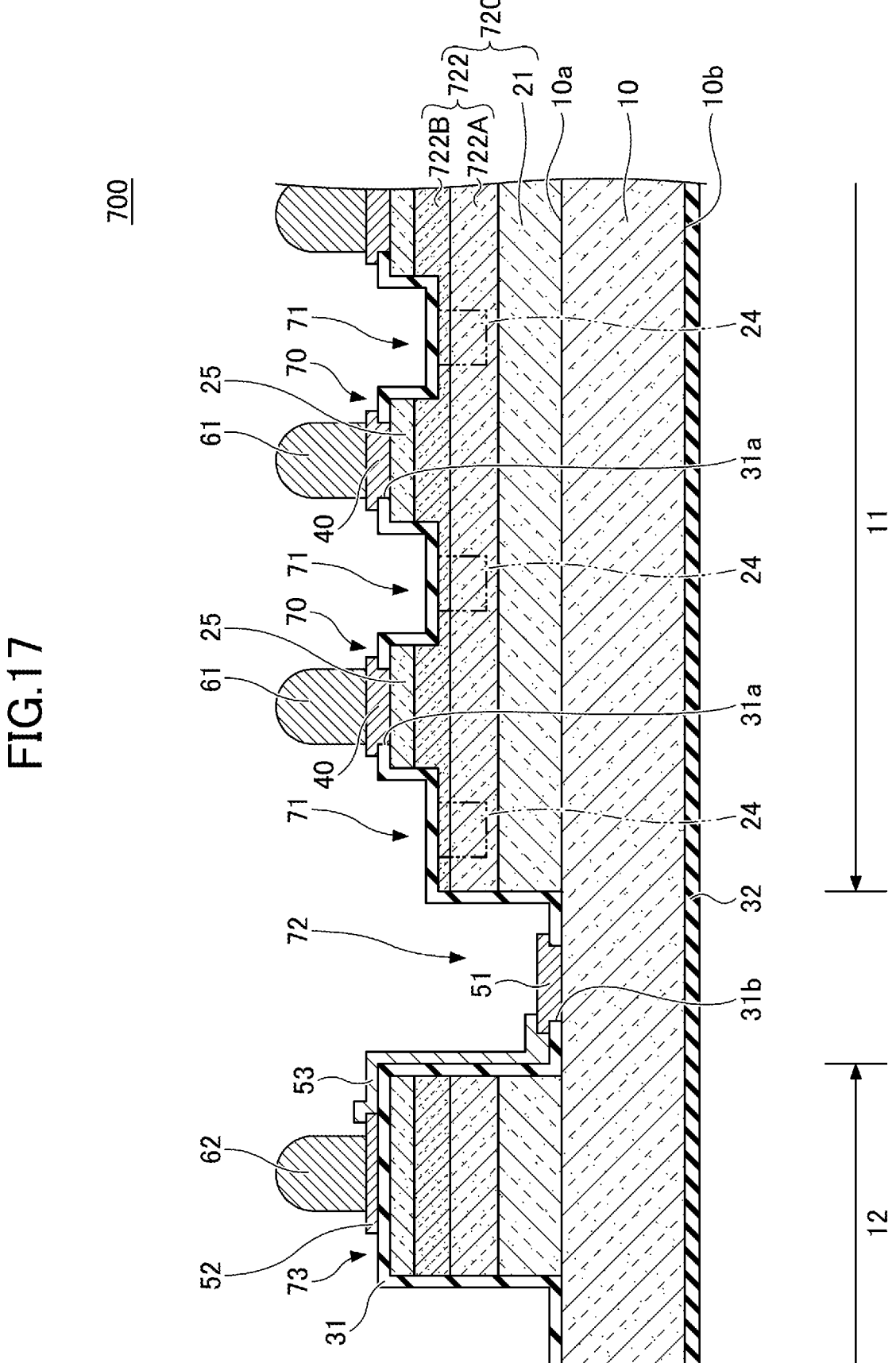
FIG. 17 is a cross-sectional view illustrating the light receiving element according to a fourth embodiment.

Hereinafter, a fourth embodiment will be described. The fourth embodiment differs from the first embodiment mainly in the configuration of the light receiving layer. FIG. 17 is a cross-sectional view illustrating the light receiving element according to the fourth embodiment.

A light receiving element 700 according to the fourth embodiment includes a light receiving layer 720, instead of the light receiving layer 620. The light receiving layer 720 includes the first semiconductor layer 21 and a second semiconductor layer 722. The second semiconductor layer 722 includes, for example, an InGaAs layer 722A and an AlInAs layer 722B. The AlInAs layer 722B is provided on the InGaAs layer 722A. The thickness of each of the InGaAs layer 722A and the AlInAs layer 722B is about 1 μm, for example. For example, a composition of the InGaAs layer 722A is $In_{0.53}Ga_{0.47}As$, and a composition of the AlInAs layer 722B is $Al_{0.47}In_{0.53}As$. Even when the composition of the InGaAs layer 722A is $In_{1-y}Ga_yAs$ (0.454≤y≤0.499), lattice distortion between the InGaAs layer 722A and InP can be suppressed to be as small as possible. Even when the composition of the AlInAs layer 722B is $Al_xIn_{1-x}As$ (0.464≤x≤0.509), lattice distortion between the AlInAs layer 722B and InP can be suppressed to be as small as possible.

Each first groove 71 is formed in portions of the p-type contact layer 25 and the AlInAs layer 722B, and the AlInAs layer 722B is exposed at the bottom surface of the first groove 71. That is, the bottom surface of the first groove 71 is situated at the AlInAs layer 722B. The upper surface of each n-type region 24 constitutes at least a portion of the bottom surface of the first groove 71. The n-type regions 24 may be provided only in the AlInAs layer 722B, may be provided in the InGaAs layer 722A and the AlInAs layer 722B, or may be provided in the first semiconductor layer 21 and the second semiconductor layer 722.

Although an impurity is not intentionally implanted into the AlInAs layer 722B, the AlInAs layer 722B has a weak n-conductivity type due to incorporation or the like of incidental impurities. With this arrangement, a p-n junction is present between the AlInAs layer 722B and the p-type contact layer 25.

Other configurations in the fourth embodiment are the same as those in the first embodiment.

In the light receiving element 700 according to the fourth embodiment, the light receiving layer 720 has the n-type embodiment, the light receiving layer 720 has the n-type regions 24 each of which has an n-conductivity type and that are each situated in the exposed portion of the bottom surface of the first groove 71. The upper surface of each n-type region 24 constitutes at least a portion of the bottom surface of the first groove 71. With this arrangement, even when an n-type impurity that is incidentally contained in the light receiving layer 720 is reduced during formation of the antireflective film 32, a sufficient amount of the n-type impurity is present in the light receiving layer 720, and thus crystal leakage can be suppressed. Therefore, dark current can be reduced in the fourth embodiment.

In addition, in the fourth embodiment, the second semiconductor layer 622 has the AlInAs layer 722B. Thus, as in the third embodiment, surface leakage can be further suppressed compared to the first embodiment.

The AlInAs layer 722B has high sensitivity in a wavelength range of 0.9 μm or less, for example, but does not absorb light in a wavelength range of greater than or equal to 1.0 μm and less than or equal to 1.6 μm. With this arrangement, in the third embodiment, sensitivity in the wavelength range of greater than or equal to 1.0 μm and less than or equal to 1.6 μm may be reduced compared to the first embodiment. In contrast, in the fourth embodiment, the second semiconductor layer 622 includes the InGaAs layer 722A, in addition to the AlInAs layer 722B, and thus sensitivity comparable to that in the first embodiment is obtained in the wavelength range of greater than or equal to 1.0 μm and less than or equal to 1.6 μm.

Fifth Embodiment

Figure 18:
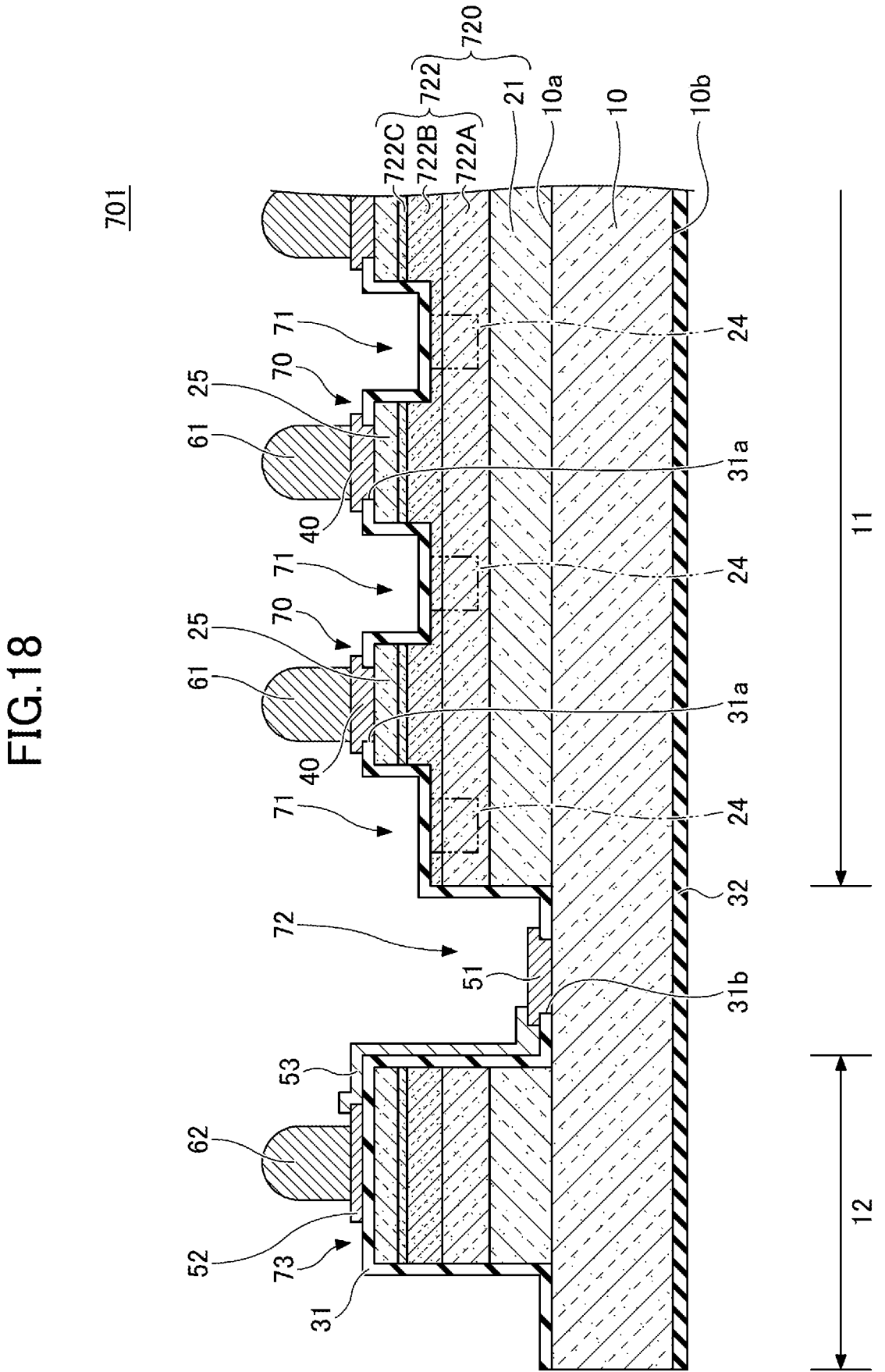
FIG. 18 is a cross-sectional view illustrating the light receiving element according to a fifth embodiment.

Hereinafter, a fifth embodiment will be described. The fifth embodiment differs from the fourth embodiment mainly in the configuration of the light receiving layer. FIG. 18 is a cross-sectional view illustrating the light receiving element according to the fifth embodiment.

In a light receiving element 701 according to the fifth embodiment, a light receiving layer 720 includes a p-type AlInAs layer 722C, in addition to the InGaAs layer 722A and the AlInAs layer 722B. The p-type AlInAs layer 722C is provided on the AlInAs layer 722B. The p-type AlInAs layer 722C contains, for example, Zn in a concentration of about $1 \times 10^{19}$ cm$^{-3}$. The thickness of the p-type AlInAs layer 722C is, for example, about 0.1 μm. A composition of the p-type AlInAs layer 722C is $Al_{0.47}In_{0.53}As$. Even when the composition of the p-type AlInAs layer 722C is $Al_xIn_{1-x}As$ (0.464≤x≤0.509), lattice distortion between the p-type AlInAs layer 722C and InP can be suppressed to be as small as possible. In the fifth embodiment, a p-n junction is present between the AlInAs layer 722B and the p-type AlInAs layer 722C.

Each first groove 71 is formed in portions of the p-type contact layer 25, the p-type AlInAs layer 722C, and the AlInAs layer 722B. The AlInAs layer 722B is exposed at the bottom surface of the first groove 71. That is, as in the fourth embodiment, the bottom surface of the first groove 71 is situated at the AlInAs layer 722B. The upper surface of each n-type region 24 constitutes at least a portion of the bottom surface of the first groove 71.

Other configurations in the fifth embodiment are the same as those described in the fourth embodiment.

In the fifth embodiment, the same effect as described in the fourth embodiment is obtained.

In the third embodiment, a p-type AlInAs layer corresponding to the p-type AlInAs layer 722C may be provided between the second semiconductor layer 622 and the p-type contact layer 25.

Sixth Embodiment

Figure 19:
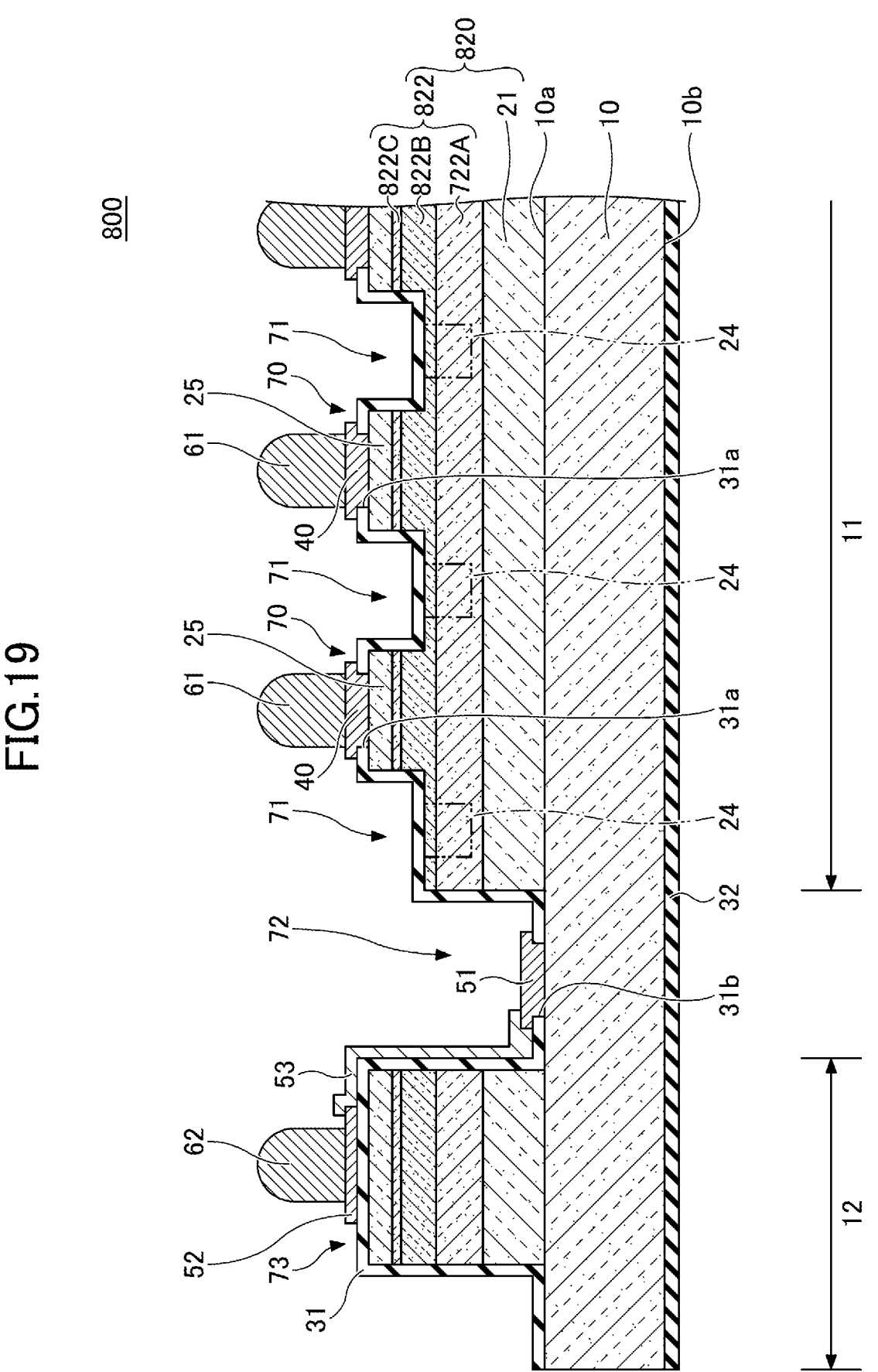
FIG. 19 is a cross-sectional view illustrating the light receiving element according to a sixth embodiment.

Hereinafter, a sixth embodiment will be described. The sixth embodiment differs from the fifth embodiment mainly in the configuration of the light receiving layer. FIG. 19 is a cross-sectional view illustrating the light receiving element according to the sixth embodiment.

A light receiving element 800 according to the sixth embodiment includes a light receiving layer 820, instead of the light receiving layer 720. The light receiving layer 820 includes the first semiconductor layer 21 and a second semiconductor layer 822. The second semiconductor layer 822 includes, for example, an InGaAs layer 722A, an InP layer 822B, and a p-type InP layer 822C. The InP layer 822B is provided on the InGaAs layer 722A. The p-type InP layer 822C is provided on the InP layer 822B. The thickness of the InP layer 822B is, for example, about 1 μm. The p-type InP layer 822C contains, for example, Zn in a concentration of about $1 \times 10^{18}$ cm$^{-3}$. The thickness of the p-type InP layer 822C is, for example, about 0.1 μm.

Each first groove 71 is formed in portions of the p-type contact layer 25, the p-type InP layer 822C, and the InP layer 822B. The InP layer 822B is exposed at the bottom surface of the first groove 71. That is, the bottom surface of the first groove 71 is situated at the InP layer 822B. The upper surface of each n-type region 24 constitutes at least a portion of the bottom surface of the first groove 71. The n-type regions 24 may be provided only in the InP layer 822B, may be provided in the InGaAs layer 722A and the InP layer 822B, or may be provided in the first semiconductor layer 21 and the second semiconductor layer 822.

Although an impurity is not intentionally implanted into the InP layer 822B, the InP layer 822B has a weak n-conductivity type due to incorporation or the like of incidental impurities. With this arrangement, a p-n junction is present between the InP layer 822B and the p-type InP layer 822C.

Other configurations in the sixth embodiment are the same as those described in the fifth embodiment.

In the light receiving element 800 according to the sixth embodiment, the light receiving layer 820 has the n-type regions 24 each of which has an n-conductivity type and that are each situated at the exposed portion of the bottom surface of the first groove 71. The upper surface of each n-type region 24 constitutes at least a portion of the bottom surface of the first groove 71. With this arrangement, even when an n-type impurity incidentally contained in the light receiving layer 820 is reduced during formation of the antireflective film 32, a sufficient amount of the n-type impurity is present in the light receiving layer 820, and thus crystal leakage can be suppressed. Therefore, dark current can be reduced in the sixth embodiment.

According to the sixth embodiment, the second semiconductor layer 822 includes the InP layer 822B. A bandgap of InP is larger than a bandgap of InGaAs. For example, in performing a comparison using a composition that is lattice—matched to InP, the bandgap of In$_{0.53}$Ga$_{0.47}$As is 0.73 eV, and the bandgap of InP is 1.35 eV. Therefore, according to the sixth embodiment, surface leakage can be further suppressed compared to the first embodiment.

The bandgap of InP is smaller than the bandgap of AlInAs, but P contained in the InP is less likely to be oxidized than As contained in the AlInAs. Thus, surface leakage can be suppressed compared to the fifth embodiment.

In the third embodiment, the fourth embodiment, the fifth embodiment, and the sixth embodiment, a light detector according to the second embodiment can be adopted as in the first embodiment. That is, instead of the light receiving element 100, the light detector 200 according to the second embodiment may include a given light receiving element among light receiving elements 600, 700, 701, and 800.

In the present disclosure, the second semiconductor layer is not limited to the InGaAs layer or the AlInAs layer. The second semiconductor layer may include an Al$_x$Ga$_y$In$_{1-x-y}$As layer ($0 \leq x < 1$, $0 \leq y < 1$, and $0 < x+y < 1$).

Hereinafter, other tests that the inventors of this application have conducted will be described.

(Third Test)

Figure 20:
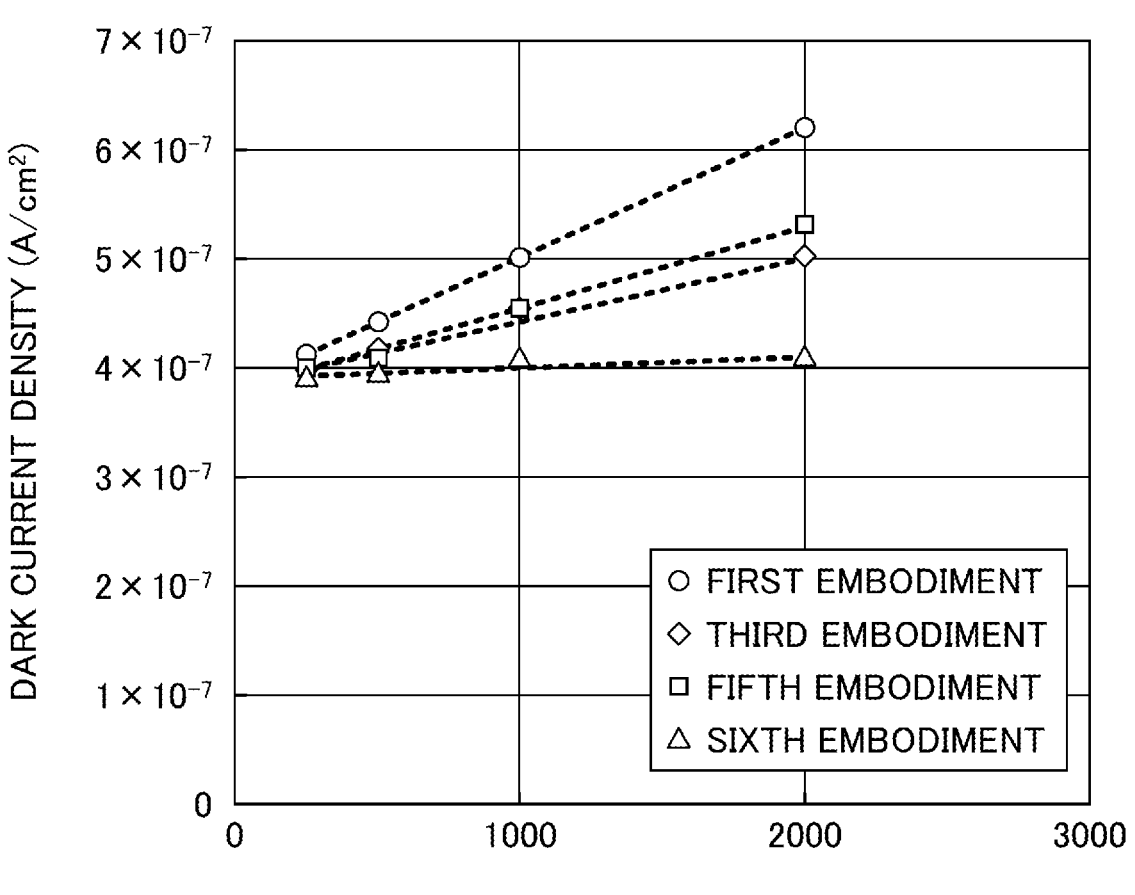
FIG. 20 is a graph illustrating the relationship between a dimensional parameter and dark current density.

In a third test, the relationship between a dimension of the mesa 70 and dark current density was checked. In the third test, a plurality of samples were prepared in light of the first embodiment, the third embodiment, the fifth embodiment, and the sixth embodiment. Further, in light of the first embodiment, the third embodiment, the fifth embodiment, and the sixth embodiment, four types of samples in which mesas 70 had different sizes were fabricated. Specifically, planar shapes of the mesas 70 for the four samples were squares, where each side of each of the squares was a different length, e.g., 20 μm, 40 μm, 80 μm, or 160 μm. The dark current Id through each sample was measured. The result is illustrated in FIG. 20. On a graph illustrated in FIG. 20, the horizontal axis represents a dimension parameter (P/A) that is obtained by dividing a peripheral length P of the mesa 70 by an area A in a plan view, and the vertical axis represents density (Id/A) of the dark current Id. FIG. 20 is a graph illustrating the relationship between the dimensional parameter and the dark current density.

On the graph illustrated in FIG. 20, surface leakage is reflected in slopes. In the third embodiment and the fifth embodiment, slopes on the graph are approximately the same. In the third embodiment and the fifth embodiment, slopes on the graph are smaller than that in the first embodiment. In the sixth embodiment, a slope on the graph is smaller than that in each of the third embodiment and the fifth embodiment. This result indicates that the surface leakage in the third embodiment occurs as in the fifth embodiment, indicating that the surface leakage in the third embodiment and the fifth embodiment is suppressed in comparison to the first embodiment. Further, the result indicates that the surface leakage in the sixth embodiment is further suppressed in comparison to the third embodiment and the fifth embodiment.

(Fourth Test)

In a fourth test, samples were fabricated in light of the first embodiment and the third embodiment, and then the relationship between the wavelength and quantum efficiency was checked.

Figure 21:
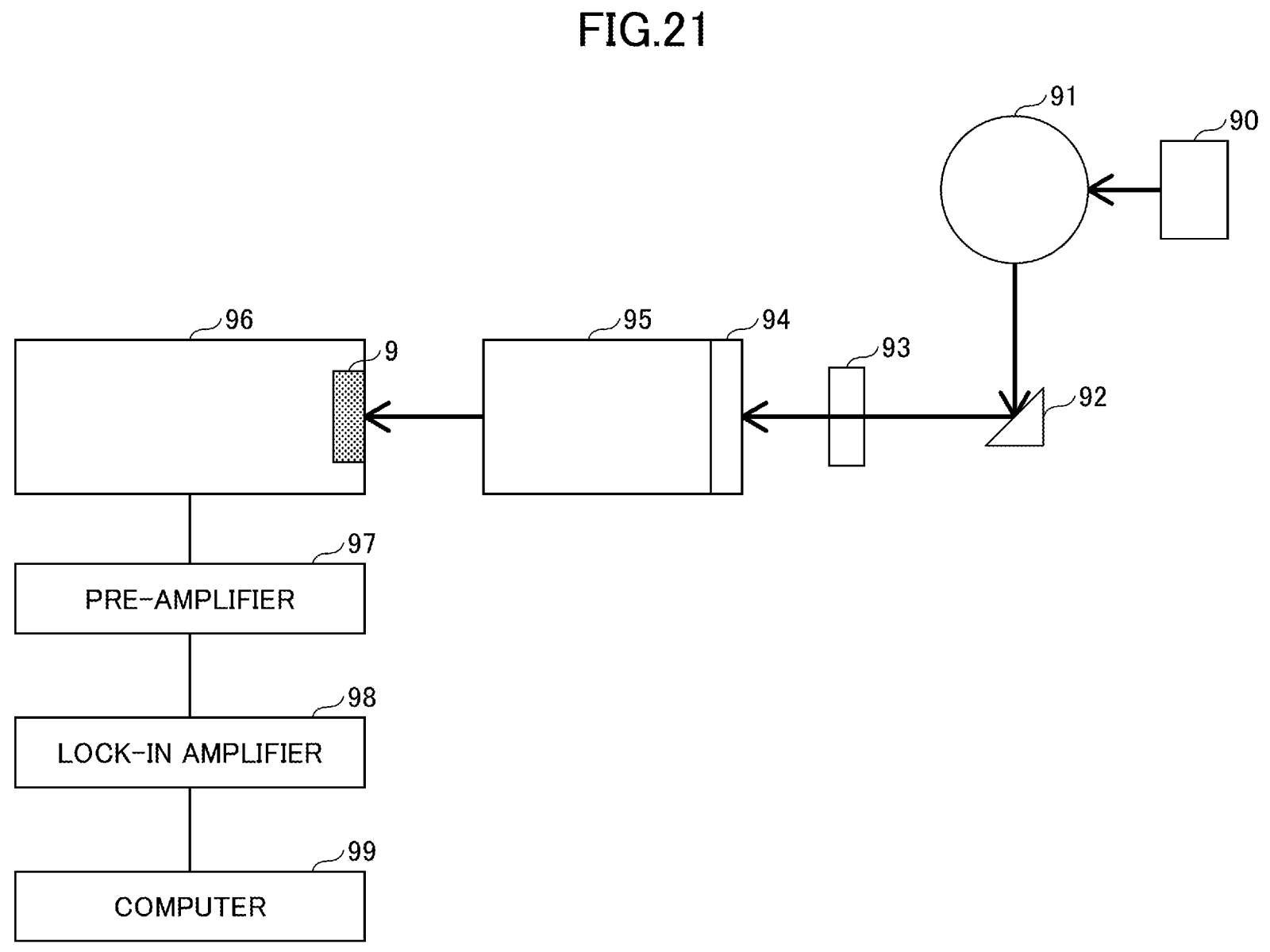

Now, an approach to measure the quantum efficiency will be described. FIG. 21 is a diagram illustrating a measurement system used to measure the quantum efficiency. As illustrated in FIG. 21, the measurement system includes a halogen lamp 90, an integrating sphere 91, a mirror 92, a chopper 93, a low-pass filter 94, a spectroscope 95, a Dewar 96, a pre-amplifier 97, a lock-in amplifier 98, and a computer 99. The halogen lamp 90 emits light within a wavelength range of greater than or equal to 350 nm and less than or equal to 3500 nm. The integrating sphere 91 collects the light emitted by the halogen lamp 90, and delivers the light to the mirror 92. The mirror 92 reflects the light emitted from the integrating sphere 91, so that the light is delivered to the spectroscope 95. The chopper 93 is disposed between the mirror 92 and the spectroscope 95, and the low-pass filter 94 is disposed between the chopper 93 and the spectroscope 95. A sample 9 is attached to the Dewar 96, and then is cooled by the Dewar 96. The spectroscope 95 disperses the light that has passed through the chopper 93 and the low-pass filter 94, and irradiates the sample 9 with the dispersed light. The pre-amplifier 97 amplifies an output signal of the sample 9. With use of the chopper 93, the lock-in amplifier 98 measures the current that is obtained by reducing noise that is included in the output signal of the pre-amplifier 97. The computer 99 analyzes the output signal (current magnitude) from the lock-in amplifier 98, to determine quantum efficiency.

Figure 22:
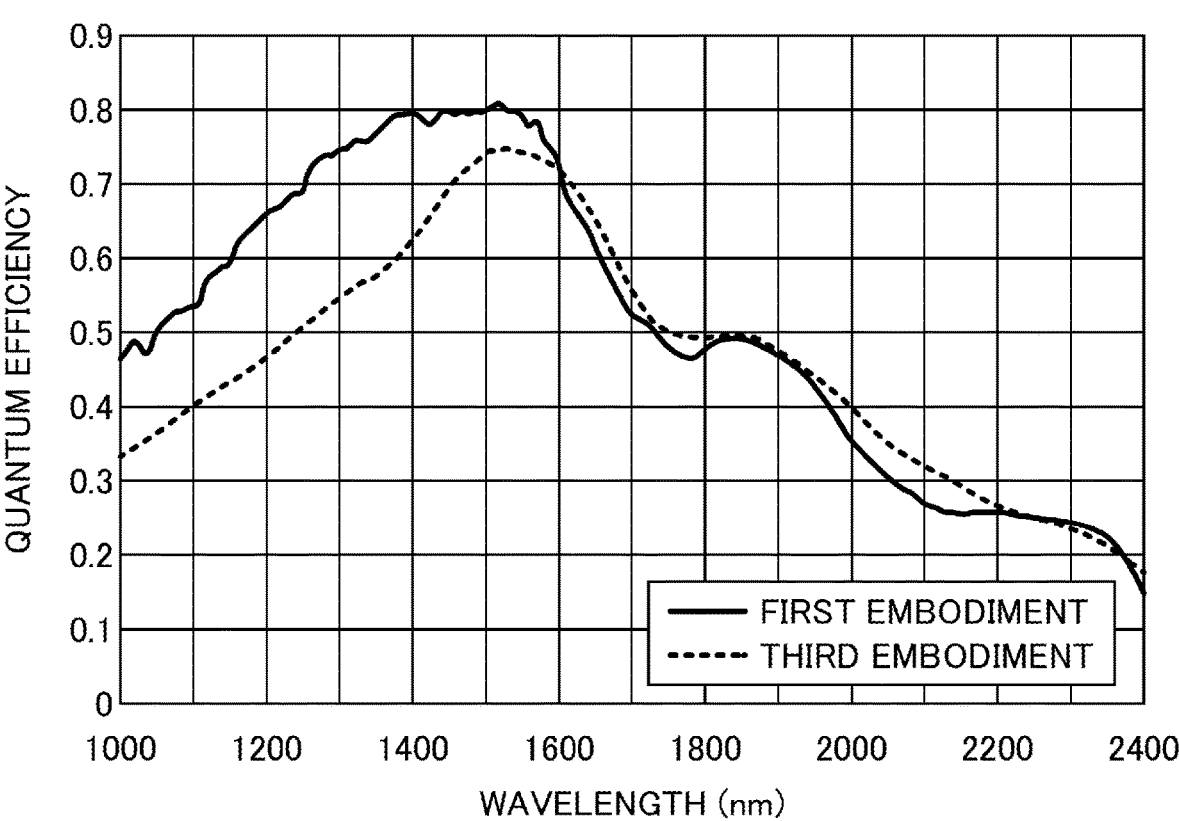
FIG. 22 is a graph illustrating the relationship between a wavelength and the quantum efficiency.

When measuring the quantum efficiency, the sample 9 was cooled to a temperature of −60° C. by the Dewar 96, while applying the voltage of −2 V to the sample 9. Further, an amount of incident light was measured using a calibration sample, and the relationship between the wavelength and the amount of incident light was obtained. Then, data of the wavelength and the current magnitude was collected by the computer 99, and the quantum efficiency for each wavelength was calculated. The results of the calculation are illustrated in FIG. 22. FIG. 22 is a graph illustrating the relationship between the wavelength and the quantum efficiency.

As illustrated in FIG. 22, in the third embodiment, quantum efficiency is lower than that in the first embodiment, in the wavelength range of greater than or equal to 1.0 μm and less than or equal to 1.6 μm. This is because the AlInAs layer included in the second semiconductor layer 622 does not have sensitivity in the wavelength range of greater than or equal to 1.0 μm and less than or equal to 1.6 μm. Also, in the fourth embodiment, the fifth embodiment, and the sixth embodiment, it is considered that quantum efficiency similar to that in the first embodiment is obtained.

Although the embodiments are described above in detail, the embodiments are not limited to one or more specific embodiments, and various modifications and changes can be made within the scope described in the present disclosure.

In the present disclosure, dark current can be reduced.

What is claimed is:

1. A light receiving element comprising:
a substrate having a first main surface;
a light receiving layer provided on the first main surface, and including:
a first semiconductor layer provided on the first main surface, and
a second semiconductor layer provided on the first semiconductor layer, the second semiconductor layer having a top surface and a bottom surface;
a contact layer provided on the light receiving layer; and
a groove that separates the contact layer for each pixel, the groove having a bottom surface,
wherein the first semiconductor layer includes a type-II quantum-well layer including an InGaAs layer and a GaAsSb layer, and
wherein the second semiconductor layer includes a $Al_x$-$Ga_yIn_{1-x-y}As$ layer, where $0 \leq x < 1$, $0 \leq y < 1$, and $0 < x+y < 1$,
wherein the bottom surface of the groove is situated between the top surface and the bottom surface of the second semiconductor layer,
wherein the light receiving layer includes an n-type region below an exposed portion of the bottom surface of the groove,
wherein the second semiconductor layer includes an InGaAs layer and an AlInAs layer provided on the InGaAs layer, and
wherein the bottom surface of the groove is disposed between a top surface and a bottom surface of the AlInAs layer.

2. The light receiving element according to claim 1, wherein a concentration of n-type carriers in the n-type region is $5 \times 10^{17}$ cm$^{-3}$ or more.

3. The light receiving element according to claim 1, wherein a thickness of the n-type region is 0.05 μm or more.

4. The light receiving element according to claim 1, wherein a distance between the n-type region and the contact layer is 1.0 μm or more in a plan view perpendicular to the first main surface.

5. The light receiving element according to claim 1, wherein the substrate includes an n-type InP substrate.

6. The light receiving element according to claim 1, wherein the n-type region includes hydrogen as an n-type impurity.

7. The light receiving element according to claim 1, further comprising:
an antireflective film provided on a second main surface of the substrate opposite the first main surface.

8. A light receiving element comprising:
a substrate having a first main surface;
a light receiving layer provided on the first main surface, and including:
a first semiconductor layer provided on the first main surface, and
a second semiconductor layer provided on the first semiconductor layer, the second semiconductor layer having a top surface and a bottom surface;
a contact layer provided on the light receiving layer; and
a groove that separates the contact layer for each pixel, the groove having a bottom surface,
wherein the first semiconductor layer includes a type-II quantum-well layer including an InGaAs layer and a GaAsSb layer, and
wherein the second semiconductor layer includes a $Al_x$-$Ga_yIn_{1-x-y}As$ layer, where $0 \leq x < 1$, $0 \leq y < 1$, and $0 < x+y < 1$,
wherein the bottom surface of the groove is situated between the top surface and the bottom surface of the second semiconductor layer,
wherein the light receiving layer includes an n-type region below an exposed portion of the bottom surface of the groove,
wherein the second semiconductor layer includes an InGaAs layer and an InP layer provided on the InGaAs layer, and
wherein the bottom surface of the groove is disposed between a top surface and a bottom surface of the InP layer.

9. The light receiving element according to claim 8, wherein a concentration of n-type carriers in the n-type region is $5 \times 10^{17}$ cm$^{-3}$ or more.

10. The light receiving element according to claim 8, wherein a thickness of the n-type region is 0.05 μm or more.

11. The light receiving element according to claim 8, wherein a distance between the n-type region and the contact layer is 1.0 μm or more in a plan view perpendicular to the first main surface.

12. The light receiving element according to claim 8, wherein the substrate includes an n-type InP substrate.

13. The light receiving element according to claim 8, wherein the n-type region includes hydrogen as an n-type impurity.

14. The light receiving element according to claim 8, further comprising:
an antireflective film provided on a second main surface of the substrate opposite the first main surface.

* * * * *